United States Patent
Bett et al.

(10) Patent No.: US 10,205,044 B2
(45) Date of Patent: Feb. 12, 2019

(54) ADJUSTMENT-TOLERANT PHOTOVOLTAIC CELL

(71) Applicant: Fraunhofer-Gesellschaft zur Förderung der angewandten Forschung e.V., Munich (DE)

(72) Inventors: Andreas Bett, Freiburg (DE); Simon Philipps, Freiburg (DE); Kasimir Reichmuth, Merzhausen (DE); Henning Helmers, Freiburg (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 14/653,452

(22) PCT Filed: Dec. 19, 2013

(86) PCT No.: PCT/EP2013/077406
§ 371 (c)(1),
(2) Date: Jun. 18, 2015

(87) PCT Pub. No.: WO2014/096200
PCT Pub. Date: Jun. 26, 2014

(65) Prior Publication Data
US 2015/0380591 A1    Dec. 31, 2015

(30) Foreign Application Priority Data
Dec. 21, 2012   (DE) .......................... 10 2012 025 160

(51) Int. Cl.
*H01L 31/054* (2014.01)
*H01L 31/0687* (2012.01)

(52) U.S. Cl.
CPC ...... *H01L 31/0687* (2013.01); *H01L 31/0543* (2014.12); *Y02E 10/52* (2013.01); *Y02E 10/544* (2013.01)

(58) Field of Classification Search
CPC ....................... H01L 31/0687; H01L 31/0543
See application file for complete search history.

(56) References Cited

U.S. PATENT DOCUMENTS

| 4,249,959 A | 2/1981 | Jebens |
| 2006/0048811 A1 | 3/2006 | Krut et al. |

(Continued)

FOREIGN PATENT DOCUMENTS

| DE | 10 2004 055 225 A1 | 6/2006 |
| WO | WO 8100647 A1 | 3/1981 |
| WO | WO 2012/149650 A1 | 11/2012 |

OTHER PUBLICATIONS

Löckenhoff, R. et al., "Development, Characterisation and 1000 Suns Outdoor Tests of GaAs Monolithic Interconnected Module (MIM) Receivers", 2008, pp. 101-112, Progress in Photovoltaics: Research and Applications 16(2).

(Continued)

*Primary Examiner* — Bethany L Martin
(74) *Attorney, Agent, or Firm* — Brinks Gilson & Lione

(57) ABSTRACT

An adjustment-tolerant photovoltaic cell in which the front face has at least three sub-segments which can be directly struck by electromagnetic radiation is provided. At least two sub-segments are in the form of a first segment type, and at least one sub-segment is in the form of a second segment type. The sub-segments can be arranged such that at least two separate segment regions, which can be directly struck by the electromagnetic radiation, are formed for each of the first and the second segment types. At least two sub-segments of the first segment type can be connected to each other in parallel and/or are connected to each other via a (Continued)

transition region which ensures the lateral flow of current. Furthermore, the sub-segments of the first segment type can be connected in series to the at least one sub-segment of the second segment type.

17 Claims, 13 Drawing Sheets

(56) References Cited

U.S. PATENT DOCUMENTS

| | | |
|---|---|---|
| 2007/0137698 A1 | 6/2007 | Wanlass et al. |
| 2008/0128014 A1 | 6/2008 | Van Riesen et al. |
| 2011/0108082 A1 | 5/2011 | Werthen et al. |
| 2014/0158189 A1* | 6/2014 | Kleiman ............ H01L 31/0725 |
| | | 136/255 |

OTHER PUBLICATIONS

Helmers, H. et al., "Processing Techniques for Monolithic Interconnection of Solar Cells at Wafer Lever", dated Dec. 2010, pp. 3355-3360, IEEE Transactions on Electron Devices, vol. 57, No. 12.

Yang, J. et al., "Silicon-Based Multi-Junction Solar Cell With 19.7% Efficiency At 1-Sun Using Areal Current Matching for 2-Terminal Operation", 2011, pp. 1019-1024, $37^{th}$ Photovoltaic Specialists Conference, DOI: 10.1109/PVSC.2011.6186125, Seattle, Washington.

Helmers, H. et al., "Advanced Processing Techniques Used for the Development of Dual-Junction Monolithic Interconnected Modules", dated Apr. 7, 2010, pp. 39-42, Proceedings of $6^{th}$ International Conference on Concentrating Photovoltaic Systems, AIP Conference Proceedings, DOI: 10.1063/1.3509227, Freiburg, Germany.

Wojtczuk, S. et al., "InGaAs Concentrator Cells for Laser Power Converters and Tandem Cells", dated 1993, pp. 119-128, NASA-Report N94-11394, NASA, ntrs.nasa.gov.

Rieske, R et al., "Assembly tolerance requirements for photonics packaging of multi-cell laser power converters", dated Sep. 17, 2012, pp. 1-6, Electronic System-Integration Technology Conference, Amsterdam, Netherlands.

Schubert, J et al., "High-Voltage GaAs Photovoltaic Laser Power Converters", dated Jan. 28, 2009, pp. 170-175, IEEE Transactions on Electron Devices, IEEE Service Center, Piscataway, New Jersey.

Sohr, S et al., "Assembly tolerant design of multi-cell laser power converters for wafer-level photonic packaging", dated May 28, 2013, pp. 1866-1873, Electronic Components Conference, IEEE, Las Vegas, Nevada.

* cited by examiner

ADJUSTMENT-TOLERANT PHOTOVOLTAIC CELL

CROSS-REFERENCE TO RELATED APPLICATIONS

This application is a national stage entry of International Patent Application PCT/EP2013/077406, filed Dec. 19, 2013, entitled "ADJUSTMENT-TOLERANT PHOTOVOLTAIC CELL," the entire contents of which are incorporated by reference, which in turn claims priority to German patent application DE 10 2012 025 160.2, filed Dec. 21, 2012, entitled "JUSTAGETOLERANTE PHOTOVOLTAISCHE ZELLE", the entire contents of which are incorporated by reference.

BACKGROUND

Solar cells use the photovoltaic effect for directly converting sunlight into electrical energy. This effect is not just restricted to sunlight, but can also be used for converting light—or more generally electromagnetic radiation—from other sources. In particular, mention may be made of optical power transmission (also known as "power over fiber"). In this technique, photovoltaic cells are irradiated with artificial light (or more generally: artificially generated electromagnetic radiation) which is generated by means of lasers, LEDs or halogen emitters, for example, in order to supply energy to small consumers, for example. It is thus possible to implement energy transmission (more precisely: power transmission) without metal cables and by this means to avoid short circuits, damage as a result of overvoltages and the like. The artificial electromagnetic radiation is transmitted to the photovoltaic cell either via the air or by means of dense media such as fiber optic cables, for example.

BRIEF DESCRIPTION OF THE DRAWINGS

The embodiments may be better understood with reference to the following drawings and description. The components in the figures are not necessarily to scale.

Moreover, in the figures, like-referenced numerals designate corresponding parts throughout the different views.

DETAILED DESCRIPTION

Figure 1:
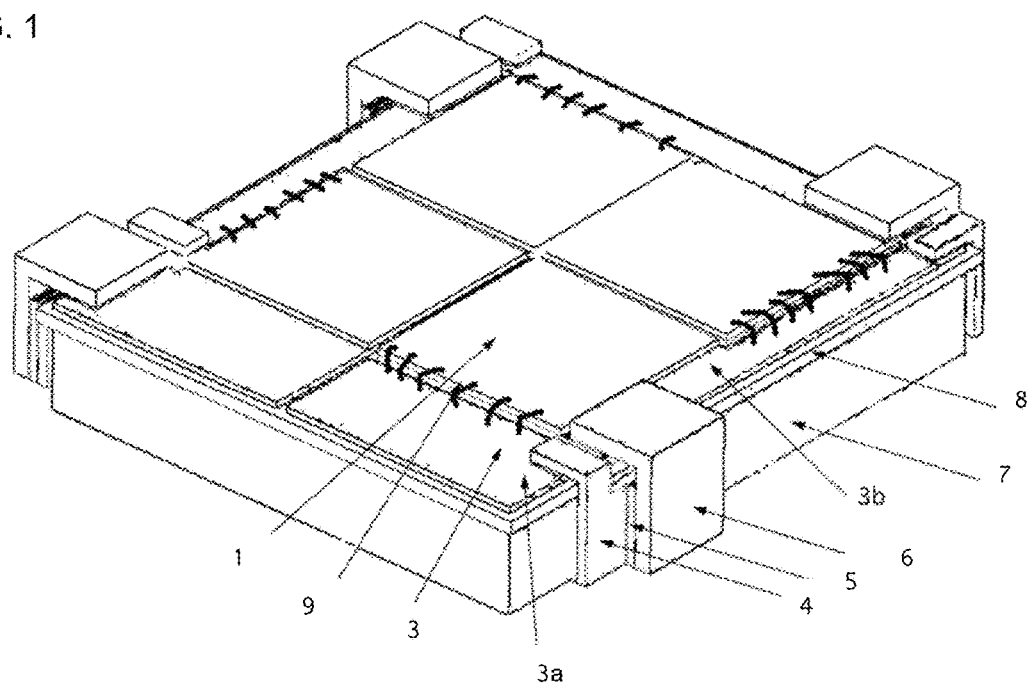
FIG. 1 shows subsegments arranged laterally with respect to one another and which exhibits a series interconnection of the subsegments.

The invention relates to a photovoltaic cell having at least four segment regions to which electromagnetic radiation can be applied directly, and at least three subsegments among which said segment regions are distributed. This arrangement can be chosen such that the segment regions are arranged only laterally alongside one another; however, also a photovoltaic multi-junction cell can be chosen in which the different segment regions are present in the at least two subcells of the multi-junction cell that are arranged one above another. In this case, the upper subcell has "recesses" as it were, such that a direct application of electromagnetic radiation can be realized for two separate segment regions of the lower subcell.

One essential challenge for optical power transmission is the provision of a sufficiently high voltage for the operation of the consumers operated by the photovoltaic cell. The majority of solar cells currently produced are so-called single-junction solar cells consisting of just one pn junction. Their voltage is essentially determined by the semiconductor material used. Comparatively high voltages for single-junction cells can be achieved using the semiconductor GaAs. However, the open terminal voltage is maximally in the region of 1 V and is thus too low for the operation of typical electronic circuits.

As is known, the voltage and the conversion efficiency of solar cells can be increased with monolithic multi-junction solar cells, where a plurality of solar subcells are stacked one above another. The best solar cells at the present time consist of three pn junctions in different semiconductor materials, which are internally interconnected in series via tunnel diodes. The next generation of multi-junction solar cells will contain four or more pn junctions in order to increase the efficiency further. For converting laser light, stacks of two subcells (i.e. tandem cells) have already been realized (J. Schubert et al., IEEE Transactions on Electron Devices, 56(2), pages 170-175, 2009). In this stack, two pn junctions (consisting of a semiconductor material with a tunnel diode) were interconnected in series. Open terminal voltages of around 2.4 V were thus achieved on the basis of the semiconductor material GaAs.

The interconnection of the series connected pn junctions in multi-junction cells with stacked subcells according to the prior art can be carried out monolithically or else mechanically. The pn junctions consist of semiconductor materials having different band gaps, usually composed of germanium and/or so called III-V compound semiconductors, which are material compositions of the elements of main groups III and V, for example gallium arsenide, gallium indium arsenide or gallium indium phosphide, or other semiconductors, such as II-VI compound semiconductors. In these cells, the band gap energy of the pn junctions increases from the bottommost to the topmost subcell.

Multi-junction solar cells are often realized as monolithic stacks. The different semiconductor layers are therefore grown or stacked directly one above another. These are grown onto a doped or undoped substrate in crystalline layers for example by means of metal organic vapor phase epitaxy (MOVPE) or other epitaxial methods, such as LPE (Liquid Phase Epitaxy) or MBE (Molecular Beam Epitaxy) for example. A series interconnection of the subcells arises in which—as explained below—the total current of the layer stack is limited by the subcell having the lowest current. For example, wafers made of silicon, germanium or gallium arsenide can be used as substrate. In general, a partial metallization—the contact grid—is applied on the front side of a monolithic multi-junction cell. The back side is generally metalized over the whole area. These metallizations serve as front and back side contacting. An interconnection of the individual cells or of the individual subsegments can be carried out with these metallizations. Metallic connectors, such as wire bonds or metal strips, are usually used for this purpose.

A plurality of multi-junction solar cells are often interconnected in series, thus giving rise to a solar module in which the individual multi-junction solar cells are arranged alongside one another; according to the present invention, such an arrangement is referred to as subsegments arranged laterally alongside one another (wherein the subsegments can then form both multi-junction cells and single-junction cells and are interconnected to form a photovoltaic cell); such subsegments interconnected with one another accordingly correspond to a solar module with interconnected multi-junction solar cells.

In the case of the series connection, the current intensity is limited by the solar cell (or the subsegment) that generates the least current, while the voltages are added. If one solar cell supplies less current than the other solar cells in the series connection or no current at all, then the current flow is limited or completely interrupted. In order to prevent this, according to the prior art, in the module the current flow is ensured by the use of bypass diodes, such that the solar cell that supplies no current is protected against destruction. A bypass diode is a diode connected anti-parallel with respect to the solar cell and opens up a further current path alongside the solar cell. In the case of reduced generation of current, for example as a result of shading or a defect, the solar cell in this regard is not loaded (as a result of which it might be destroyed), rather the current flows via the bypass diode. In normal operation (if all of the cells or segments supply a similar current), the bypass diode is blocking in order not to generate any losses. In concentrator modules having high current densities, but also generally in the case of series connection, ideally each individual separate solar cell is protected with a bypass diode.

For the monolithic series interconnection of the individual pn junctions, a current flow between the n doped semiconductor materials of a subcell and the p doped semiconductor materials of the next subcell has to be made possible. This is usually realized by means of interband tunnel diodes in the photovoltaic multi-junction cells. Tunnel diodes are highly doped diodes connected oppositely to the solar cells. That means that the n doped layer of the solar cell is followed by the highly doped n type layer (usually written: $n^{++}$) of the tunnel diode. The highly doped p type layer ($p^{++}$) of the tunnel diode is followed by the p doped layer of the next solar cell. Customary dopings of the tunnel diodes are in the range of from $1*10^{19}$ to more than $1*10^{20}$ 1/cm$^3$. The dopings of the solar cells are in the range of $1*10^{16}$ to $8*10^{18}$ 1/cm$^3$. The layers of the solar cells and tunnel diodes include additional layers such as barrier layers, window layers and passivation layers. Merely for the sake of completeness, reference should be made to DE 10 2004 055 225 A1, which discloses monolithically integrated series interconnected modules with an integrated bypass diode. In these modules, a plurality of solar cell segments are connected in series. That means that the area of the overall cell is subdivided into segments. By means of physical or photolithographic and chemical processings, segments are connected in series on a wafer, i.e. monolithically integrated series interconnected modules are produced. WO 1980US00945 also describes monolithically integrated series interconnected photovoltaic cells in which a plurality of photovoltaic single-junction cells or subsegments are interconnected laterally directly on the wafer. This principle has also been realized for sunlight (R. Löckenhoff, Progress in Photovoltaics: Research and Applications 16(2): pages 101-112, 2008) and has also been described for laser light (S. Wojtczuk, NASA Report N94 11394, 1993). A realization with laser light and GaAs and other III-V semiconductors as absorber material is disclosed by J. Schubert et al. (IEEE Transactions on Electron Devices 56(2), pages 170 175, 2009). The concept has also been applied in so-called thermophotovoltaics, where an infrared radiation source is used. in this case it is crucial that a semi insulating substrate is used, which no longer permits traditional front and back side contacting. In this technology, firstly the semiconductor layer structure of a single-junction or multi-junction solar cell is produced epitaxially on a semi-insulating substrate, wherein a highly conductive transverse conduction layer and, if appropriate, a tunnel diode are inserted below the single solar cell layers. In the subsequent processing, individual photovoltaic cells are defined by means of suitable photolithography, etching and metallization steps, and interconnected in series directly (i.e. without separation by sawing). Different geometries can be defined and a different number of subcells can be interconnected in series. Using this concept, i) open terminal voltages of more than 6 V have already been achieved under laser light in the case of interconnection of six subsegments made of GaAs and ii) voltages of 25 V to 52 V and even above 54 V have been realized in the case of solar cells (cf. H. Helmers, Proceedings of 6th International Conference on Concentrating Photovoltaic Systems, 2010, AIP1277, pages 39-42, DOI: 10.1063/1.3509227). Again, subcells or subsegments have to be current-matched in order to achieve high efficiencies. The degree of current-matching is controlled by the size of the subsegments and the power distribution of the incident light.

Multi-junction solar cells can be used for applications in which concentrated light is converted into electricity. The concentration of the light is realized by reflective or refractive optical units, such as mirrors or lenses. The light is focused onto the solar cell. The concentration factor of the light is up to 50-fold concentration in the case of low concentration systems, 50- to 200-fold concentration in the case of medium concentrations and 100- to more than 1500-fold concentration in the case of high concentration systems. As a result of the concentration of the light, the solar cell area can be reduced by approximately the concentration factor. By the use of cost effective optical units, costs can be minimized. In close packed concentrator modules, the irradiation is typically approximately homogeneous, i.e. all the subcells have the same size in order to achieve current-matching.

In addition, photovoltaic cells—as already mentioned—can be used in optical power transmission. This is typically based on point symmetrical irradiation rather than homogeneous irradiation. If a uniform illumination of the subcells is taken as a basis, then with the available geometries the subsegments are generally distributed symmetrically around the midpoint (mathematically exactly: the geometrical centroid) in order to achieve current-matching.

In reality, however, deviations from the ideal power distribution of the incident electromagnetic radiation or of the incident light and/or inhomogeneous illuminations are usually present. These can be caused for example by inaccuracies in the adjustment or else by properties of optical units used (by way of example, concentrator optics may be positioned inaccurately with respect to the solar cell, shape defects or microstructural defects of the optical unit may be present, deviations resulting from secondary optical units may play a part, or optical unit and system may be aligned inaccurately with respect to the radiation source, for example the sun). In the case of optical power transmission, in particular an inaccurate adjustment of radiation source and/or a radiation transfer medium is problematic (for example the use of lasers as radiation source and optical fibers as optical waveguides). In addition, problems can arise as a result of the use of secondary optical units or obliquely incident light on the photovoltaic cell. Finally, the production of exactly identical subcells or the subsegments is technologically difficult. Consequently, it is a major challenge to design current-matching.

Therefore, the present application is based on the object of overcoming the disadvantages of the prior art and of specifying an adjustment tolerant photovoltaic cell comprising a plurality of subsegments. In particular, the photovoltaic cell is intended to be current-matched and to generate a high voltage. A further object is to specify a photovoltaic cell comprising a plurality of subcells which is tolerant toward deviations from the ideal power distribution of the incident light. Finally, another object is to specify a photovoltaic cell comprising a plurality of subcells which is tolerant toward temperature fluctuations.

According to the invention a novel concept of a photovoltaic cell which generates high voltages is presented. Such a photovoltaic cell can be used for optical power transmission in the field of power-over-fiber applications and for applications which do not use a laser as radiation source, but rather use some other light source or radiation source, and also for concentrator systems. The concept can manifest its major advantages particularly if the photovoltaic cell is produced by means of a technology which allows sequential layer deposition (for example MOVPE, MBE or vapor deposition).

An adjustment tolerant photovoltaic cell according to the invention has a front side facing the incident electromagnetic radiation (during operation) and a back side facing away from said radiation. The front side furthermore has at least three subsegments on which the electromagnetic radiation can impinge directly. It goes without saying that the subsegments in each case are formed from a semiconductor material and allow (exactly) one pn junction.

"Impinge directly" should be understood to mean that no further semiconductor layers through which the impinging electromagnetic radiation might be absorbed are arranged between the front side of the photovoltaic cell and the front side of a subsegment, respectively. In other words, subsegment or front side on which electromagnetic radiation impinges or can impinge directly means that the respective subsegment, has the pn junction arranged spatially uppermost (relative to the incident electromagnetic radiation), in a monolithic arrangement, for example.

The front side of the photovoltaic cell need not be a planar area; rather, a stepped arrangement can be present, wherein the front side of the photovoltaic cell is formed by the front side of each individual element of the steps, that is to say of each subsegment or of each segment region as defined below.

As defined above, the front side has at least three subsegments; these three subsegments in turn are present in the form of at least four separate segment regions.

While the definition of a "subsegment" is oriented to the electronic interconnections within the photovoltaic cell, the term "segment region" relates to the optical conditions and describes substantially self-contained regions of the front side on which electromagnetic radiation can impinge directly.

The link between the terms "subsegment" and "segment region" is established by the "segment type". Thus, a subsegment can be identical to a segment region because the subsegment is formed such that over the whole area electromagnetic radiation can impinge directly on the front side; however, the subsegment can also have two segment regions on which electromagnetic radiation can impinge directly, between which there is a region of the subsegment on which no electromagnetic radiation can impinge directly, for instance because a further semiconductor layer is arranged above said region that at least partly absorbs electromagnetic radiation, for example in the form of an overlying subsegment. According to the invention, embodiments where a complete absorption takes place in the case of shading are considered to a first approximation; it goes without saying, however, that this does not correspond to reality, rather often only an absorption of up to 90 to 95% of the incident power takes place because the shading layer is normally not embodied with a sufficient thickness that a complete absorption can take place.

Accordingly, at least two subsegments of the front side of the photovoltaic cell according to the invention are arranged in the form of a first segment type and at least one subsegment is arranged in the form of a second segment type such that for the first and second segment types in each case at least two separate segment regions are formed on which electromagnetic radiation can impinge directly.

Besides two segment regions completely separated from one another, embodiments are also possible in which the two separate segment regions are not interrupted by a region on which electromagnetic radiation cannot impinge directly. In these embodiments without an "interruption region", however, the impinging electromagnetic radiation has such a low radiation intensity in the "separating region" that this comes close or is substantially tantamount to an interruption of the segment regions and it is thus possible to refer to this as separate segment regions. Such an embodiment is present for example if—as is usually the case the intensity maximum of the incident electromagnetic radiation is incident in the region of the geometrical centroid of the front side. On account of the Gaussian distribution of the radiation intensity that is often present, the radiation intensity then decreases greatly proceeding from the geometrical centroid, such that in the outer regions of the photovoltaic cell there is only a relatively low radiation intensity present, which amounts to a maximum of 10% of the maximum intensity, for example.

According to the invention, "in the region of the geometrical centroid of the front side" always means that only that region is meant which is formed by a concentric circle around the geometrical centroid whose surface area is 50% of the front side (on which electromagnetic radiation can impinge directly). The above definition "two separate segment regions at least in the region of the geometrical centroid of the front side" means, therefore, that the definition of segment regions completely separated from one another is valid at least in a concentric circle around the geometrical centroid whose surface area is 50% of the front side.

As mentioned above, the term subsegments is linked to the electronic interconnection. Therefore, according to the invention, at least two subsegments of the first segment type are interconnected in parallel with one another and/or two subsegments are connected to one another via a transition region via which a lateral current flow is ensured. The subsegments of the first segment type are interconnected in series with the at least one subsegment of the second segment type.

According to the application, "a transition region that ensures the lateral current flow" is understood to mean that between two segment regions not only a linkage that ensures the lateral current flow by means of a busbar or the like is possible, but also (for example for reasons of process economy on account of an etching method) a bar composed of semiconductor material remains between two segment regions, which bar is formed from the same material as these two segment regions but ultimately fulfils electronically the same function as or a similar function to a busbar. However, the diameter of said transition region is small in comparison with the maximum extents of the subsegments. Maximum extent should be understood here to mean the longest path which can be formed between two arbitrary points of the edges of the subsegment (either the radius or the chord in the case of a circle sector; the diagonal in the case of a square). The diameter of the transition region is in particular a maximum of 20%, usually a maximum of 10%, for example a maximum of 5%, of the maximum extent of one of the two subsegments connected to the transition region.

The photovoltaic cell according to the invention can ultimately be present either in a stepped arrangement comprising subsegments of the front side that are present in different subcells (hereinafter often referred to as "stepped embodiment") or an arrangement comprising subsegments of the front side that are arranged laterally alongside one another (hereinafter often referred to as "lateral embodiment"). Moreover, an arrangement is also possible in which both embodiments mentioned above coexist.

In the case of the stepped embodiment, the photovoltaic cell comprises at least one first subcell and one second subcell arranged below the first subcell. The first segment type is then present at least in the first subcell and the second segment type at least in the second subcell. The front side area of the first subcell is then smaller than the front side area of the underlying second subcell, the stepped arrangement thereby being formed. In this stepped embodiment, therefore, at least one first subcell is present which is formed by the first segment type and below said first subcell, the second subcell is arranged such that two separate segment regions are formed on the second subcell (at least in the region of the geometrical centroid of the front side). Further, in the first subcell subsegments are interconnected in parallel with one another and/or a transition region that ensures the lateral current flow.

In the case of the lateral embodiment (comprising subsegments arranged laterally with respect to one another), at least four subsegments are present, of which two subsegments together form the second segment type and are therefore interconnected in parallel with one another and/or are connected to one another by a transition region that ensures the lateral current flow. Two further subsegments form the first segment type, which are likewise interconnected in parallel and/or are connected to one another via a transition region that ensures the lateral current flow. Therefore, segment regions arranged laterally alongside one another are present—apart from mixed forms with the stepped embodiment.

According to the invention, therefore, it has been recognized that by realizing an arrangement comprising different segment regions, of which in each case at least two are interconnected in parallel with one another or (which is tantamount thereto with regard to the electronic conditions) are connected to one another by a transition region that ensures the lateral current flow, or of a plurality of segment regions which are all present in a subsegment, an extremely tolerant design with regard to misalignment or incorrect adjustment is made possible (if, at the same time, two segment region groups interconnected in this way are interconnected in series with one another). If a photovoltaic cell embodied in a circular fashion is taken as a basis, for example, in which the at least four segment regions are present, then upon the pivoting of a circular light spot arranged congruently above the circular photovoltaic cell, a partial shading of subsegments and/or segment regions of the first segment type and subsegments and/or segment regions of the second segment type will always take place at the same time. Since the segment regions and/or subsegments of a segment type are always connected in parallel or connected to one another, however, a shaded segment region is then always connected to a non-shaded segment region; therefore, the current-matching of the series connection is substantially maintained as a result of the partial parallel connection. This concept can additionally be optimized by determining, with regard to a given radiation source, how the radiation intensity that impinges on the front side is distributed over the front side, such that the regions having particularly high radiation intensity is distributed as uniformly as possible among the subsegment groups interconnected in series with one another. The arrangement according to the invention therefore allows the compensation of misalignments between cell and radiation source and minimizes losses resulting therefrom. In the case of the stepped embodiment, therefore, the topmost subcell is embodied in such a way that a displacement of the impinging light spot or of the impinging electromagnetic radiation (which originates for example from a laser, an optical fiber or a concentrating optical unit) has the same effects on the electricity generation of all the subcells and/or subsegment groups. The same correspondingly applies to the lateral embodiment, wherein geometry and arrangement of the subsegments interconnected in parallel with one another are chosen accordingly.

The stepped embodiment entails yet another advantage: as has already been explained in the introduction, current-matching of the subcells in photovoltaic multi-junction cells in the case of specific irradiations (in particular under a specific spectrum and a specific distribution of the optical power over the cell) constitutes a major technical challenge. Crucial is, firstly, the choice of the semiconductor material used. Further material properties, the charge carrier mobility and the lifetime of the charge carriers additionally play a part. As soon as the material has been defined, according to the prior art an attempt is made to achieve the current-matching by matching the thicknesses of the subcells. This is difficult from a technical standpoint, however, if for example the material quality varies from epitaxy to epitaxy or is too poor or too small thicknesses have to be chosen. In the case of the tandem cell according to J. Schubert et al. mentioned in the introduction, for the optical power transmission it was necessary to choose a small thickness of 0.6 µm for the upper subcell in comparison with the lower subcell having a thickness of 3.7 µm. A further subcell would then have to have an even smaller thickness, which from a technical standpoint is very difficult to realize or cannot be realized at all. For materials which can be realized with relatively low material quality according to the prior art (for example nitride containing layers such as GaInNAs), even the realization of double cells is difficult. In this regard, the lower subcell must in principle contain comparatively thick absorber layers in order to be able to produce enough current. Since the material quality is low and the diffusion length of the charge carriers is thus small, however, only charge carriers from a small portion of the absorber layers can contribute to the current, such that the lower subcell produces too little current. The current-matching of multi-junction cells according to the prior art must furthermore be designed for a specific operating temperature. Since the temperature influences crucial material parameters (such as, for example, the band gap, the conductivity and the mobilities), ideal current-matching is no longer present when there is a deviating temperature. For real applications—both in concentrator photovoltaics and in optical power transmission—this is a great disadvantage since the final operating conditions i) are typically not known for the design of the cell, ii) can vary greatly from application to application and iii) can fluctuate greatly even during operation.

With the stepped embodiment according to the invention comprising at least two separate segment regions in the region of the topmost subcell and the succeeding subcell, it is possible to achieve current-matching by means of the subcell size or subcell width rather than by the subcell thickness (as is implemented according to the prior art). For the purpose of current-matching, therefore, subcells situated at a lower level can be made larger or wider than the overlying subcells, which in turn leads to the stepped arrangement. Subcells situated at a lower level thus receive, in the corresponding segment regions of the front side, directly a proportion of the impinging electromagnetic radiation, in particular of the incident light, which then, unlike in conventional stacked solar cells, has therefore not already been filtered or partly absorbed by the subcells situated at a higher level. Since the subcells situated at a lower level have a larger area than the subcells situated at a higher level, the latter can be significantly thicker than in the case of a conventional photovoltaic multi-junction cell. In this way, the problem of excessively thin absorber layers is avoided and more cells composed of semiconductor material can be stacked one above another (as a result of which a higher voltage can be realized). The stepped arrangement according to the invention therefore satisfies the requirements with regard to higher voltages in a novel way. The explanations in the paragraph above thus constitute a separate inventive aspect, also independently of the specific embodiment comprising two separate segment regions in the second subcell and of the presence of two subsegments in the first subcell, particularly as far as applications for optical power transmission and/or embodiments in which the same semiconductor material is used in two subcells are concerned.

It goes without saying that more than one or two subcells can be present both in the case of the lateral embodiment and in the case of the stepped embodiment. In this regard, in the case of the lateral arrangement within a subsegment two or more subcells (interconnected in series) can also be arranged one above another. In the case of the stepped embodiment three or more subcells (interconnected in series) can also be arranged one above another, wherein only two subcell groups, for example the two topmost subcells, can have a different area which is exposable directly to electromagnetic radiation; in particular, however, at least three subcells or subcell groups can then be embodied such that they each occupy a larger area than the overlying subcell or subcell group and therefore each have segment regions which are exposable directly to electromagnetic radiation.

Therefore, if a third subcell is present in the case of a stepped embodiment, then a third segment type is also present of course—as required from the electronic definitions.

If according to the present application sublayers "arranged one above another" are mentioned, here and hereinafter this means that a first sublayer or a first subsegment is arranged "on" a second sublayer if the first sublayer or the first subsegment is applied directly in direct mechanical and/or electrical contact on the second sublayer, or that only an indirect contact is denoted, in the case of which further layers and the like are arranged between the first sublayer or the first subsegment and the second sublayer. Possible further layers of this type are, for example, the tunnel diodes described in the introduction or other layers usually present in solar cells and photovoltaic cells.

In accordance with an embodiment, the photovoltaic cell is a multi-junction cell (that is to say a photovoltaic cell with lateral embodiment which has at least two subcells, or a photovoltaic cell with stepped embodiment) in which at least two of the (at least two) subcells arranged one above another consist of materials having an equal or at least substantially equal band gap. According to the application, two materials have a "substantially equal band gap" if the difference between the band gaps of the two materials at room temperature (25° C.) is a maximum of 0.1 eV. The band gap is determined by way of evaluation of the spectral sensitivity on the finished component. In this regard, reference is made to S. Philipps et al. in "Present Status in the Development of III V Multi Junction Solar Cells"; Springer Series in Optical Sciences 165—Next Generation of Photovoltaics—New Concepts, 2012, pages 1 to 21, where the band gap can be gathered directly from FIG. 1.16 a or b, for example, in particular in accordance with the method described in H. Helmers et al., Applied Physics Letters, 2013. 103: pages 032108-1-3, DOI: 10.1063/1.4816079.

This embodiment is expedient particularly if monochromatic light of a specific wavelength is intended to be converted. This may be the case particularly in laser power applications or applications for optical power transmission. It goes without saying that with the use of monochromatic light, the band gap of the subcells have to be oriented only toward exactly one wavelength and such an embodiment is therefore advantageous.

In accordance with an alternative embodiment, at least two subcells composed of different materials are present (or exclusively subcells composed of different materials), that is to say that there is at least one subcell which is formed from a semiconductor material which differs from the material of at least one further subcell in such a way that reference can no longer be made to materials having a substantially equal band gap. A photovoltaic cell according to this embodiment can also be embodied such that the energy band gap of the subcells decreases from the topmost subcell, completely exposed to electromagnetic radiation, toward the underlying subcells.

Such an embodiment is suitable particularly for the conversion of electromagnetic radiation having a spectral distribution, as is the case for sunlight, for example. When the photovoltaic cell according to the invention is used in concentrator applications, this embodiment is therefore often realized.

According to a further embodiment, in the case of the stepped arrangement, an antireflection coating is applied after the structuring of the steps. If the stack comprises subcells made of identical materials, the antireflection coating can be optimized according to known methods, to be precise simultaneously for all of said subcells (since the optimization is carried out for a specific semiconductor structure).

According to a further embodiment, in the case of multi-junction cells, subcells composed of materials having poor material quality are chosen to be wider, such that they generate the same currents as subcells composed of good materials in the stack.

According to a further embodiment, within a photovoltaic cell having stepped embodiment subcell sequences can be present in which each subcell within a subcell sequence occupies the same area, but in two successive subcell sequences the subcell sequence situated at the bottom occupies a larger area than the overlying subcell sequence. Such a subcell sequence (which according to the prior art is usually itself designated as "multi-junction cell") can then in turn consist of identical or different materials.

In accordance with a further embodiment, the photovoltaic cell is a monolithic multi-junction cell embodied. Such a photovoltaic cell can be produced by means of the epitaxy methods described in the introduction.

In accordance with a further embodiment, the photovoltaic cell is a multi-junction cell in which subcells connected by means of tunnel diodes. The tunnel diodes serve for changing the polarity and conduct the current in both directions with a small voltage drop.

The following paragraphs will discuss the geometry of the photovoltaic cell, of the subsegments contained therein and of the segment regions contained therein. It should first be stated that the photovoltaic cell is not restricted to a specific geometry; this applies both to the photovoltaic cell as a whole and to the subcells contained therein. In this regard, the photovoltaic cell and the subcells contained therein can be circular, square, rectangular or elliptical or can substantially have such a geometry; these embodiments would appear to be particularly suitable in particular for production-dictated and economic reasons. In addition, however, also other geometries such as triangular or polygonal, for example, can be embodied. With regard to the geometry of the subsegments and of the segment regions, it should be taken into account as an important basis that according to a first approximation a homogeneous power distribution of the incident light should be assumed (even if in reality deviations from the ideal power distribution are present; however, these deviations are not predictable or are poorly predictable). At least in applications in the field of concentrator modules, the irradiation of the photovoltaic cell and thus of the subsegments can also be approximately homogeneous for example as a result of the use of secondary optical units. This has the consequence that the area of the groups of subsegments of the same segment type which are directly exposable to electromagnetic radiation should according to a first approximation be of substantially the same magnitude. In optical power transmission and in the other applications in the field of concentrator modules, by contrast, a point symmetrical irradiation will rather be present in which the incident radiation often has a power distribution which substantially corresponds to a Gaussian bell function. Accordingly, for such applications it is essential that, in particular in the region of the geometrical centroid of the front side, the groups of subsegments of the same segment type which are directly exposable to electromagnetic radiation have according to a first approximation an area of substantially the same magnitude to which radiation can be applied directly.

According to an embodiment of the present invention, in the photovoltaic cell the segment regions of the first segment type have an area which, at least in the region of the geometrical centroid of the front side, is of substantially the same magnitude as that of the segment regions of the second segment type (and of each further segment type).

Here and hereinafter, "of substantially the same magnitude" means that the summed area (which is directly exposable to electromagnetic radiation) of the segment type having the smallest surface area is at least 80% of the summed area of the segment type having the largest surface area. In general, the proportion will be even at least 90% and often even at least 95%. If only two segment types are present, then the summed area of the first segment type is therefore between 80 and 125%, in general between 90 and 111% and often between 95 and 105% of the summed area of the segment regions of the second segment type. Particularly for power applications, these explanations apply not "only" to the entire area of the segment regions of the photovoltaic cell, but in particular to the areas which lie in the region of the geometrical centroid of the front side (which is defined as above). However, it goes without saying that the explanation in the paragraph above relate to an irradiation which impinges on the photovoltaic cell homogenously. In the case of inhomogeneous irradiation, the area must also be weighted with the radiation intensity incident on said area.

According to a further embodiment, at least in the region of the geometrical centroid of the front side, the segment regions of the first segment type and the segment regions of the second segment type are alternating. The same correspondingly applies if more than two segment types are present; here, again, an alternate arrangement can be chosen in accordance with this embodiment, wherein account is taken in particular of the fact that two segments of a segment type do not become situated alongside one another or become situated alongside one another only in very small "contact regions". The way in which the geometrical arrangement has to be implemented in the case of more than two segment types is known to the person skilled in the art and moreover is also evident from geometrical considerations without relatively great assistance. However, the alternate arrangement is not a compulsorarily predefined geometrical structure; in the case of more exotic geometrical arrangements of segment regions and subsegments, embodiments are indeed conceivable in which an alternate structure cannot be specified unequivocally at all for these geometrical shapes. In addition, for interconnection reasons it is also possible to choose an arrangement in which, in the individual case, two segments of the same type also become situated alongside one another (particularly if more than six subsegments or segment regions are present).

According to a further embodiment, it is assumed in order to be somewhat more realistic—that a light cone with homogenous light distribution is incident on the front side of the photovoltaic cell, which light cone forms on the front side a circle having a circle area that is exactly 80% of the total area of the front side. In this case—as always in this application when area ratios and the like are involved—the area of the front side is equated with the area of the photovoltaically active front side. In accordance with this embodiment brought closer to reality, account is therefore taken of the fact that in reality a Gaussian distribution of the light intensity is present and the "inner 80%" of the area of the front side is thus particularly relevant in the case of ideal alignment. If said light cone is then pivoted toward the edge, depending on the arrangement of the segments or segment regions and depending on the pivoting direction the segment regions and the subsegments may be affected to different extents by the shading resulting from the pivoting. According to this embodiment, therefore, it is stipulated that the within the circle formed by the light cone the area ratio between the segment regions of the first segment type and the segment regions of the second segment type is between 0.95 and 1.05, in particular between 0.98 and 1.02. The same correspondingly applies to the area ratios—present in the circle formed by the light cone—of the summed area of each further segment type in relation to the summed areas of the segment regions of the first segment type, second segment type or each further segment type.

According to a further embodiment, in the case of two segment types and a number of segment regions that is not divisible by 4, the "opposite" segment regions are chosen such that they belong to different segment types. In a generalized way this means that "opposite" segment regions belong to identical segment types in the case of a number of segment regions that is divisible by the number of segment types and additionally divisible by 2, and "opposite" segment regions belong to different segment types in the case of a number of segment regions that is divisible by the number of segment types but is not additionally divisible by 2. Translated into geometrical terms, "opposite" means that firstly a multiplicity of straight lines are drawn through the geometrical centroid of the front side. In the case of at least one of said straight lines, often a plurality of said straight lines and in many cases also each of said straight lines, the situation is then such that the mutually mirror symmetrical straight sections (wherein the axis of symmetry is the geometrical centroid) run through segment regions which belong to different or identical segment types, as defined above. As also in the case of the embodiments above, these geometrical conditions apply at least in the region of the geometrical centroid of the front side. By means of this embodiment it is possible to ensure a particularly good distribution of the light intensities among the different segment region groups and/or segment types in the case of pivotings of the light intensity maximum in any arbitrary region.

According to a further embodiment, at least in the region of the geometrical centroid of the front side, the segment regions substantially have the shape of a circle sector, of a trapezoid, of a triangle, of a rectangle or of a square. In this case, "substantially" means that deviations from the ideal geometry are also possible within certain limits; it goes without saying that an ideal geometry can never be realized as a result of the production processes chosen and, moreover, in the case of transition regions that are intended to ensure a lateral current supply, a deviation from the ideal geometry has to be made anyway.

According to a further embodiment, the photovoltaic cell according to the invention comprises at least 6, in particular at least 8, for example at least 12, separate segment regions. In this case, the number of segment regions is also dependent on whether a stepped arrangement or a lateral arrangement of the segment regions is present. In the case of the stepped embodiment, the formation of the "step" is realized in particular by etching methods and the like in which no insulating sections need be present between the regions. With regard to possible etching methods, reference should be made to the dry etching methods and the wet etching methods described in H. Helmers et al. in IEEE Transactions on Electron Devices vol. 57, page 3355 et seq. (2010), the disclosure content of which in this respect is hereby incorporated by reference within the full scope thereof. This is different in the case of the lateral embodiment, as each "insulating section" is lost as photovoltaically available area. In this respect, for the lateral embodiment, from the standpoint of efficiency an upper limit arises, which will often be chosen to be 12, but in specific embodiments even 8 may also be deemed to be expedient as the upper limit. In the case of the stepped embodiment, this upper limit is less crucial; here the upper limit chosen will be substantially due to the production method and the precision with which the etching, for example, can be carried out.

According to a further embodiment, the photovoltaic cell is a multi-junction cell having 3 to 6 subcells stacked one above another. This applies both to the stepped embodiment and to the lateral embodiment.

According to a further embodiment, the photovoltaic cell is a solar cell, in particular a solar cell with a concentrator optical unit disposed upstream thereof. Alternatively—as already mentioned a number of times—the photovoltaic cell is a cell for optical power transmission, for example for electromagnetic radiation generated by means of a laser.

At least one of the objects according to the invention is also achieved by means of an arrangement for generating electricity which comprises a photovoltaic cell according to at least one of the embodiments described above, wherein besides the photovoltaic cell additionally means which serve for applying electromagnetic radiation to the front side of the photovoltaic cell are provided.

Such means for applying radiation can be, in particular, a light source or more generally a radiation source, for example a laser light source. The light source can generate monochromatic radiation, in particular infrared radiation, visible light or UV radiation; however, it can also comprise radiation in longer wavelength ranges or be radiation approximated to sunlight.

According to a further embodiment, the means for applying radiation can comprise a concentrator optical unit for focusing electromagnetic radiation. Said concentrator optical unit can be expedient, in particular, if the arrangement comprises one or a plurality of solar cells and sunlight is intended to be focused onto the solar cell by means of a concentrator. Moreover, it is also conceivable, to focus light generated by means of any arbitrary light source onto the photovoltaic cell in order to generate the greatest possible light intensity on the photovoltaic cell. With regard to the components and the characteristics of concentrator optical units and the solar cells corresponding thereto, reference is made to DE10 2006 007 472 A1, the disclosure content of which is hereby incorporated by reference within the full scope thereof in this regard.

According to a further embodiment, the arrangement for generating electricity comprises an optical waveguide as means for applying, said optical waveguide being arranged between the light source and the photovoltaic cell such that it is possible for light to be applied to the segment regions of the photovoltaic cell uniformly. It goes without saying that the geometrical centroid of the exit area of the optical waveguide should become situated if possible above the geometrical centroid of the front side of the solar cell.

According to a further embodiment, a secondary optical unit can also be present besides the optical waveguide and can serve as a "homogenizer". This can be a microlens array, for example.

According to a further embodiment, besides the photovoltaic cell, means are also provided which have the effect that the highest radiation intensity which is generated by the light source or which is applied to the front side of the photovoltaic cell by the concentrator optical unit impinges approximately at the geometrical centroid of the front side. In this case, "approximately at the geometrical centroid" means that the intensity maximum is displaced on a straight line between the centroid of the front side of the solar cell and the edge of the photovoltaically active region, that is to say the edge of the front side, not more than 5% of the path length toward the edge. The incident radiation intensity can be utilized particularly effectively with such an arrangement.

The invention as described above in all embodiments has the advantage that a tolerance in relation to a misalignment of the photovoltaic cell and of the light incident thereon can be increased by a segmentation of the cell and/or a structuring of the cell by steps. This can be achieved firstly by the surface of the semiconductor regions being designed in a stepped fashion, and secondly by a segmentation of the cell with subsegments interconnected in series, wherein the tolerance in relation to inhomogeneous illumination or misalignment is achieved by a parallel interconnection of different segment groups. Independently of this, the stepped multi-junction cell additionally generates the advantage that a very high voltage is obtained. In this case, it is crucial that the stepped structure enables current-matching even if a matching is not possible as a result of the subcell thickness. In this way, in particular, more subcells can be stacked and it is possible to use materials with which it is not possible to increase the current by matching the thickness (too short diffusion length of the charge carriers).

An application of the multi-junction cells described here, for example multi-junction solar cells, is expedient particularly if a photovoltaic conversion of electromagnetic radiation on very small areas is required. Here there are two central fields of application, in particular:
1. Applications for optical power transmission in which artificial light is emitted onto photovoltaic cells, which then generate electrical energy for small consumers.
2. Terrestrial concentrator systems.

In the field of applications for optical power transmission there is a great demand for photovoltaic cells having a high voltage which are tolerant in relation to inhomogeneous illumination or misalignment. The stepped multi-junction cell described in the present application has the potential to become the standard in power-over-fiber applications. In the field of concentrating photovoltaics, the realization of multi-junction solar cells comprising more than three subcells constitutes a challenge since some materials of the simplest (since lattice matched) structure cannot be realized with sufficient material quality. With the concept suggested here, these subcells can be realized in a wider fashion and can thus generate a sufficient current. Since—as explained—the present invention is particularly advantageous in particular in the case of photovoltaic cells having small areas, the (photovoltaically active) area of said cells will generally be less than 1 $cm^2$; particularly in the case of embodiments for power application, the area will usually even be less than 0.25 $cm^2$; often, an area will be present which is even less than 0.1 $cm^2$. In the field of concentrator applications, however, an area of greater than 1 $cm^2$ is also conceivable in principle, for example in the case of close packed concentrator modules.

The present invention will be explained in more detail with reference to the following figures, without intending to restrict the present invention to the specific embodiments shown here.

FIG. 1 shows an embodiment in which subsegments are arranged laterally with respect to one another and which exhibits a series interconnection of the subsegments according to the prior art. In this case, four square subsegments 1 of the photovoltaic cell are in turn arranged to form a square. The subsegments are electrically connected to electrical contact areas 3, 3a and 3b via wire bonds or conductor ribbons 9, for example. 3a and 3b are electrically insulated from one another. This embodiment also shows a bypass diode 5 with two bypass diode carriers 4 and 6 assigned to the two electrical contacts. The photovoltaic cell is arranged on a substrate 7 and is separated therefrom by an electrical insulation 8.

Figure 2:
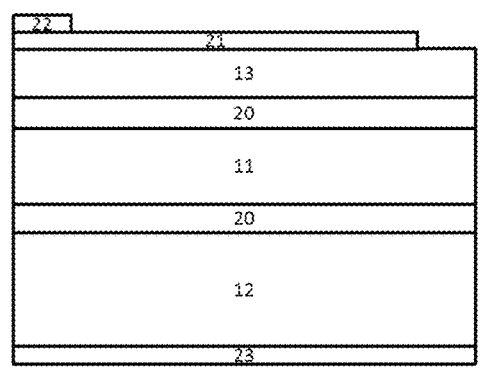
FIG. 2 shows a photovoltaic multi-junction cell.

FIG. 2 shows a photovoltaic multi-junction cell according to the prior art. A plurality of III-V semiconductor layers are provided in this case. Three subcells 11, 12, 13 are present on a p-doped substrate. Tunnel diodes 20 are arranged between the subcells 11, 12, 13. The subcells 11, 12, 13 are interconnected with one another in series by the tunnel diodes 20. A metallization 21 and an indicated bonding wire 22 are situated on the front side of the cell. A dielectric antireflection layer can also be formed between or on the metallization arranged for example in the form of busbars or over the whole area on the front side. Finally, a back side contact 23 is arranged on the back side of the solar cell.

Figure 3:
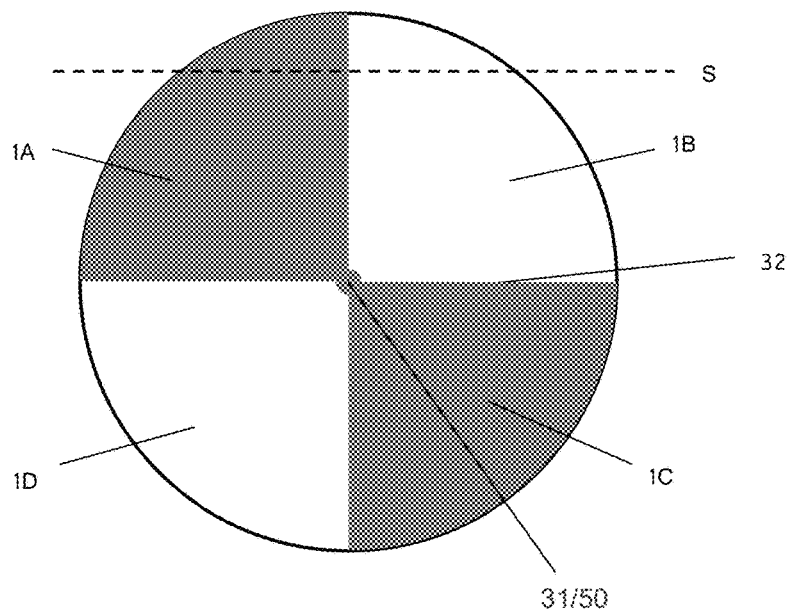
FIG. 3 shows the simplest arrangement of a photovoltaic cell according to the invention in the case of a circular geometry of the photovoltaic cell.
Figure 3A:
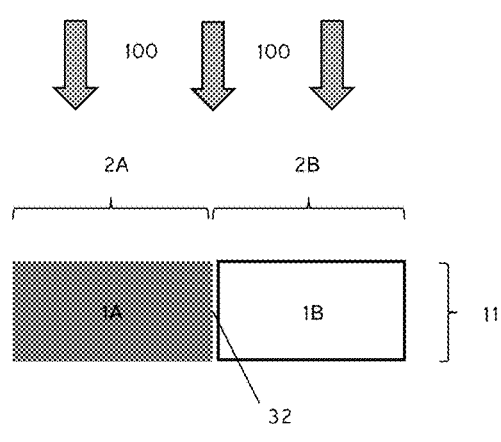
FIG. 3a shows a sectional view of the photovoltaic cell along a dashed line S for a lateral embodiment.
Figure 3B:
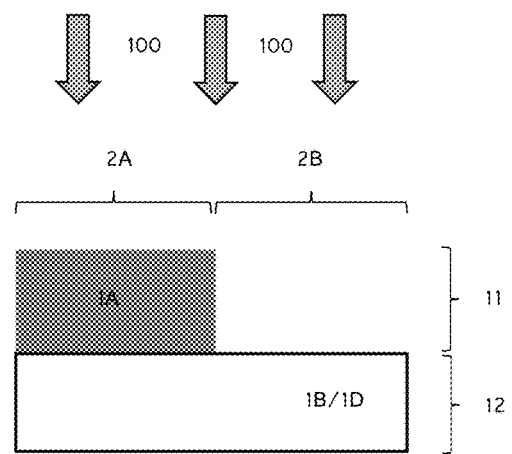
FIG. 3b shows a sectional view of a stepped embodiment of the photovoltaic cell.

FIG. 3 shows the simplest arrangement of the photovoltaic cell according to the invention in the case of a circular geometry of the photovoltaic cell. In this case, the subsegments 1A, 1B, 1C and 1D are embodied in each case as a quarter circle. At the geometrical centroid of the area, a punctiform transition region 31 that ensures the lateral current flow between the "parallel-connected" subsegments 1A and 1C is provided here, said transition region being situated at the geometrical centroid 50. Alternatively, however, the subsegments 1A and 1C could also be connected in parallel by means of a conductor track arranged outside the cell. Between the subsegments 1A and 1B, 1B and 1C, and 1C and 1D, respectively, the lateral edges of the topmost subcell 11 are situated along the lines 32 in the case of the stepped embodiment, and an isolation trench in the case of the lateral embodiment. FIG. 3a shows a sectional view of the photovoltaic cell along the dashed line S for the lateral embodiment. One can see that subsegment 1A is separated from subsegment 1B via an isolation trench 32. FIG. 3b shows a sectional view of the stepped embodiment of the photovoltaic cell. In this case, subsegment 1A is a constituent of subcell 11 and subsegments 1B and 1D are a constituent of the subcell 12. Only a part of the subsegment 1B/1D is directly exposable to electromagnetic radiation 100 from a radiation source. The segment regions 2A and 2B on which electromagnetic radiation can impinge directly accordingly arise. In the case of the stepped arrangement, therefore, only one subsegment 1B/1D in which two segment regions 2B and (not shown) 2D are present is present in the region of the subcell 12.

Figure 3C:
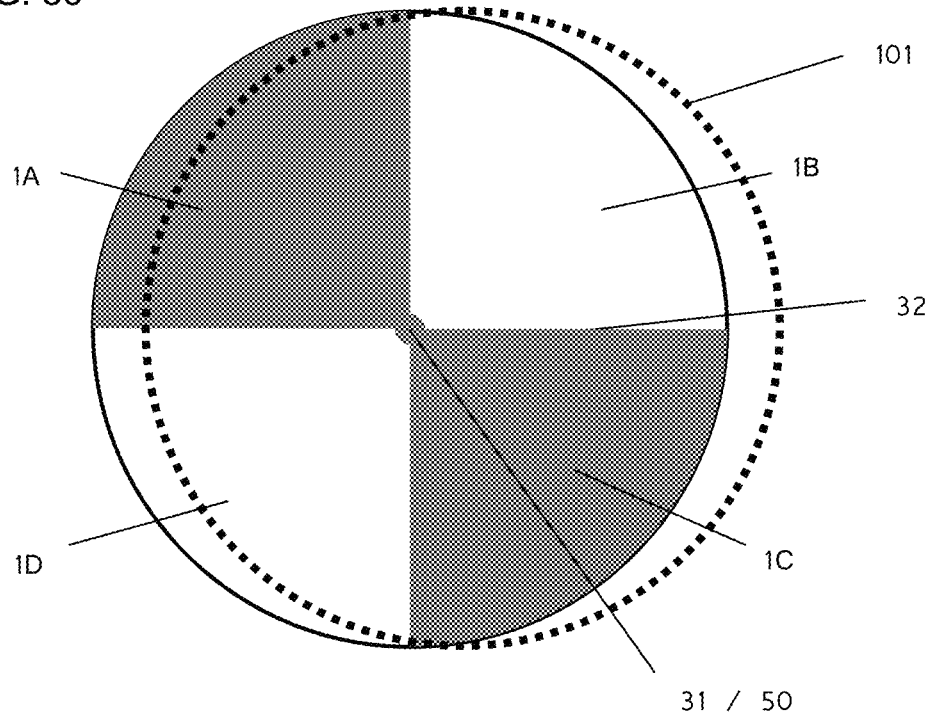
FIG. 3c shows a light spot displaced along a line between segments.
Figure 3D:
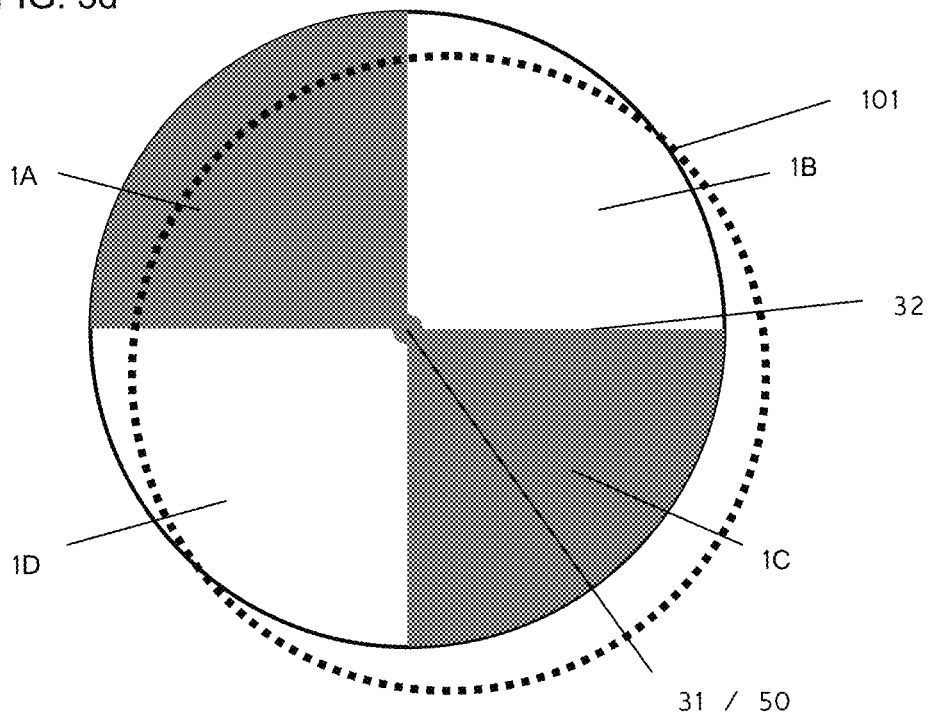
FIG. 3d shows a light spot displaced along bisectors.

If a circular light spot 101 is then irradiated by means of electromagnetic radiation 100, FIGS. 3c and 3d show the result of slight pivoting of the light spot in the two extreme cases which can occur as a result of incorrect adjustment, for example. In FIG. 3c the light spot 101 is displaced along the line 32 between the segments; in FIG. 3d along the bisectors that are formed by these lines. However, in FIG. 3d the shaded region of the parallel connected subsegments 1A and 1C is larger than that of the subsegments 1B and 1D. The change in the current of both subcells or of the parallel-connected subsegments as a result of the displacement is substantially the same; the current-matching is maintained or, in the case of FIG. 3d, is significantly improved compared with an embodiment without subsegments.

Figure 4:
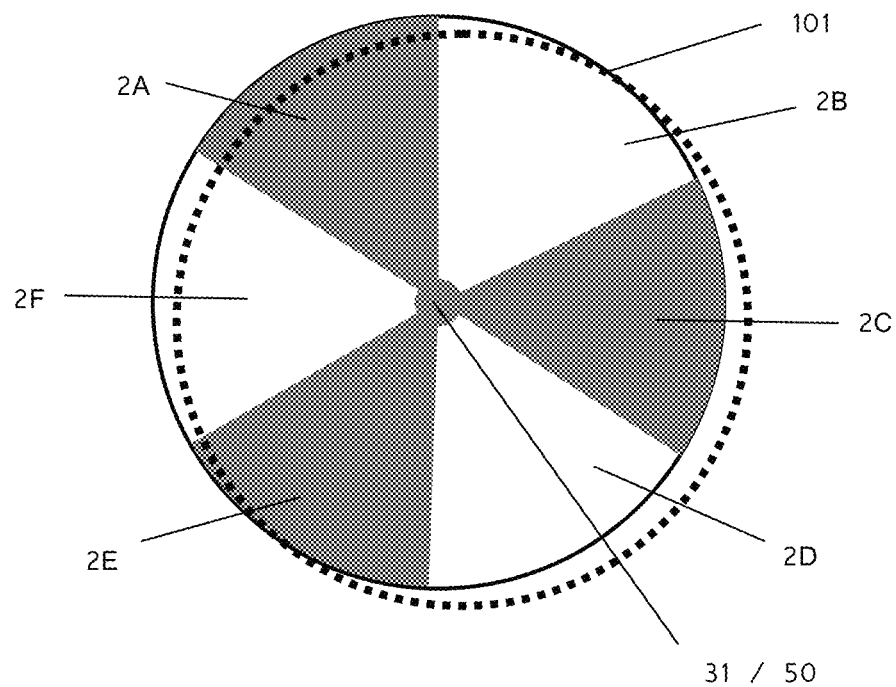
FIG. 4 shows an increased number of subsegments and/or of segment regions.

In order to reduce the effect shown in FIGS. 3c and 3d, the number of subsegments and/or of segment regions can be increased. This is shown in FIG. 4 with six segment regions 2A, 2B, 2C, 2D, 2E, 2F, which can be present both in the stepped embodiment and in the lateral embodiment. Here the segment regions 2A, 2C and 2E, on the one hand, and 2B, 2D and 2F, on the other hand, are either interconnected in parallel with one another or jointly part of the same subcell.

Figure 5:
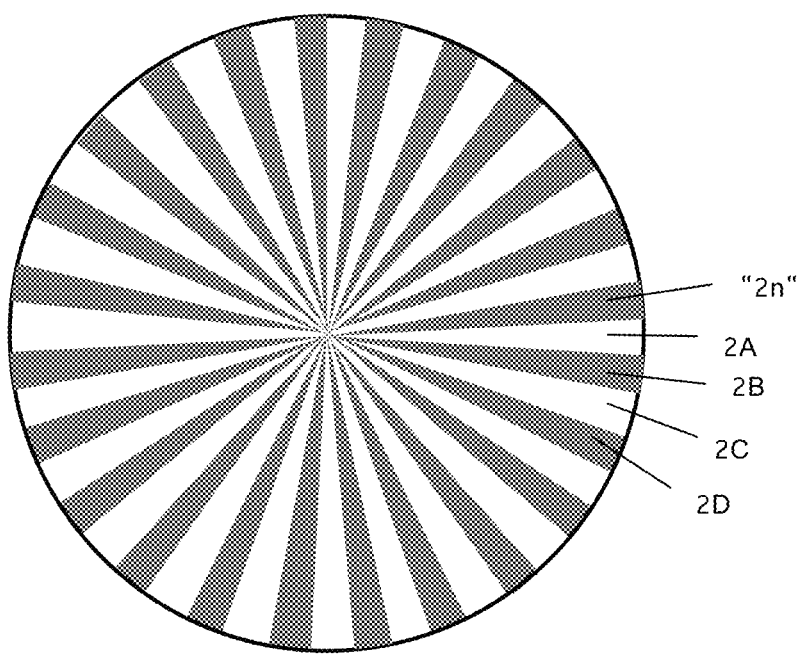
FIG. 5 shows a case with regard to shading in the case of the light spot being displaced.

FIG. 5 shows an ideal case with regard to shading in the case of the light spot being displaced. The photovoltaic cell here has a multiplicity (namely 48) of segment regions 2. The multiplicity is symbolized here by the letter n. Accordingly, the 48th segment region is designated by 2n. Here the displacement of the light spot has substantially the same effect in all directions, such that this can be referred to as a completely adjustment tolerant embodiment. Very small structures can be realized here for example by RIE etching with vertical flanks, without producing additional losses of area as a result of the etching flanks. If the structures are small enough, the transverse conduction in the emitter or transverse conduction layer of the cells becomes low loss and it is possible to dispense with a front-side metallization particularly in the lower cell in the case of a stepped arrangement; this simplifies the processing and reduces the costs. As shown already in FIGS. 3 and 4, here the area of the subsegments of the same segment type is of the same magnitude if homogeneous illumination is present. The embodiment in accordance with FIG. 5 is less suitable for the lateral arrangement since here the area occupied by the isolation trenches adversely affects the conversion efficiency.

Figure 6:
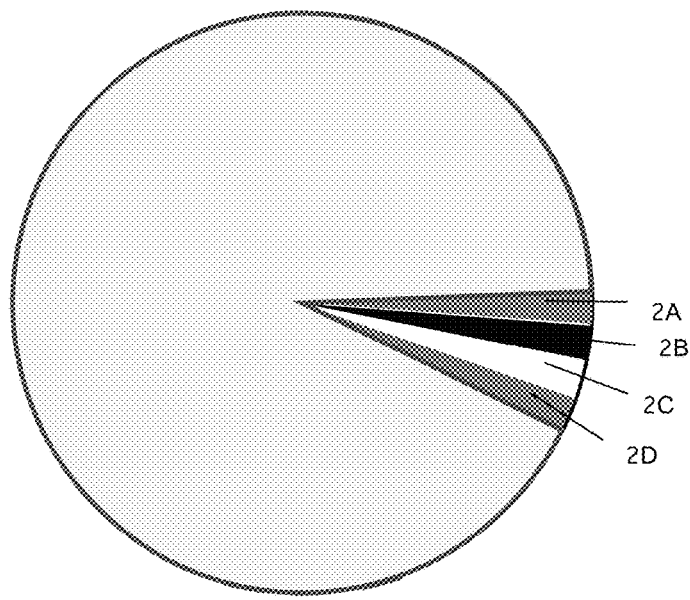
FIG. 6 shows a continuation of FIG. 5 in the case of a stepped arrangement comprising three subcells.
Figure 6A:
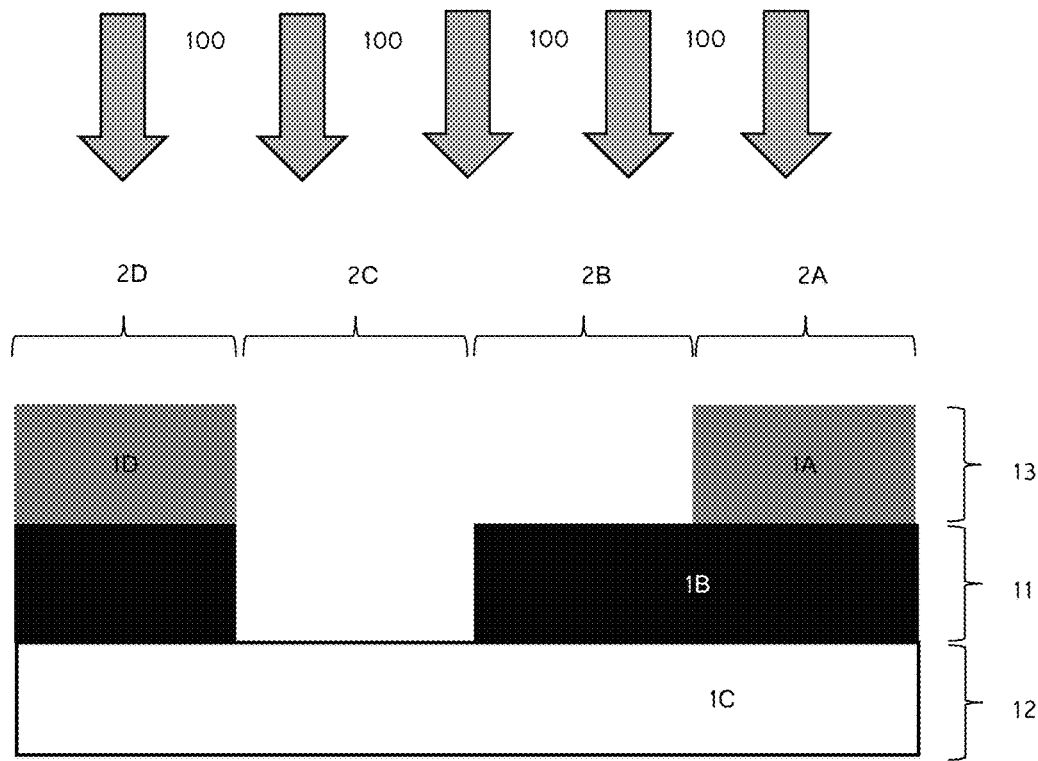
FIG. 6a shows a sectional view with three subcells and four segment regions.

FIG. 6 shows the continuation of FIG. 5 in the case of a stepped arrangement comprising three subcells. In this case, only the subcells 2A, 2B, 2C and 2D are shown by way of example; the further circle graduation corresponds to that in FIG. 5. FIG. 6a shows the sectional view with the three subcells 11, 12 and 13 and the four segment regions 2A, 2B, 2C and 2D shown by way of example. In addition, the subsegments of the exemplary region are depicted again here; segment region 2A corresponds here to subsegment 1A, segment region 2B to subsegment 1B, segment region 2C to subsegment 1C, which extends over the entire circle area, and segment region 2D to subsegment 1D, wherein subcell 11 situated below subsegment 1D also continues toward the left (not shown) and here in turn forms a segment region 2E to which electromagnetic radiation can be applied directly.

The individual subcells 11, 12 and 13 can also be formed by independent multi-junction cells, for example GaAs tandem cells. In this way, cells having approximately 6 V can be realized with three stacked and stepped double cells.

Figure 7:
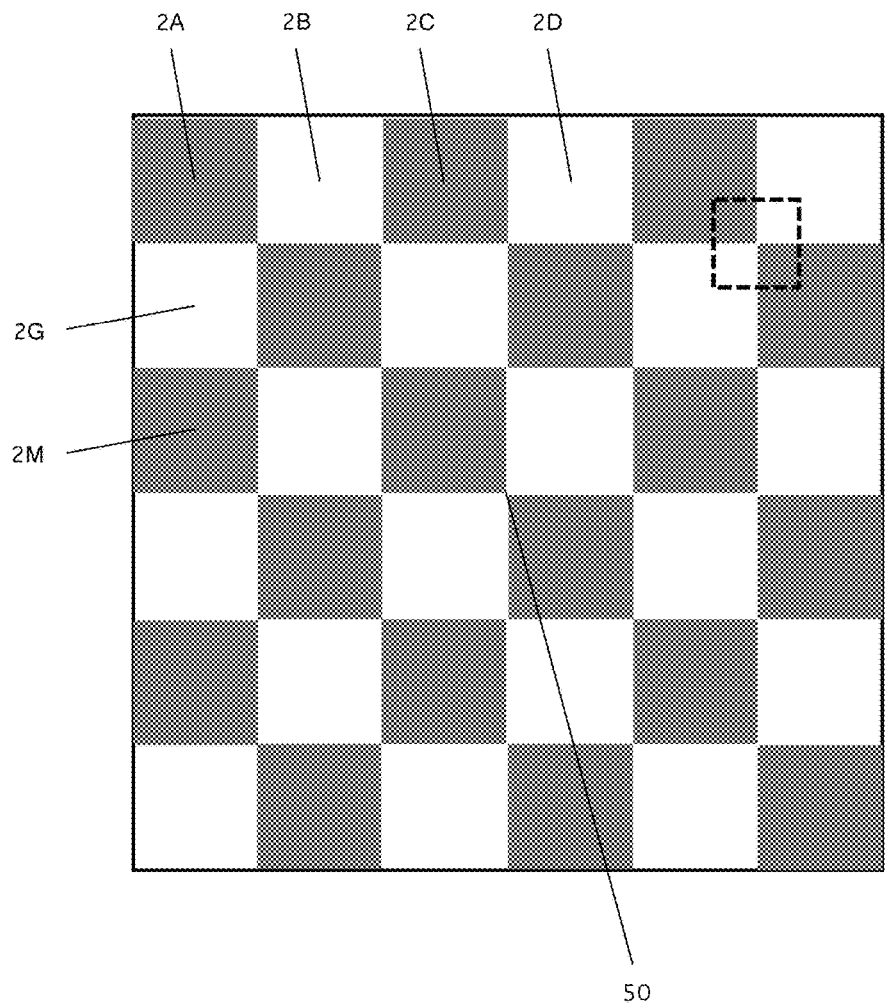
FIG. 7 shows a square photovoltaic cell formed from 36 subsegments or segment regions.

FIG. 7 shows a square photovoltaic cell formed from n=36 subsegments or segment regions. It can be discerned that the geometry of the subregions or subcells need not be embodied radially or be present in the form of circle segments. This embodiment will also be encountered more frequently than the stepped embodiment. The detail view in FIG. 7a, in which the region bounded by the dashed line from FIG. 7 is enlarged, shows the transition region 31 between two subsegments, which here are identical to two segment regions since they are present in the upper subcell 11. In order to ensure the lateral current flow, transparent transverse conduction layers can be used. If the structures are small enough, the transverse conduction in the emitter or transverse conduction layer of the cells becomes low loss and it is possible to dispense with a front-side metallization; this simplifies the processing and reduces the costs. In contrast to FIG. 3, in FIG. 7 the transition region 31 for ensuring a lateral current flow is not (only) formed in the region of the geometrical centroid 50.

Figure 7A:
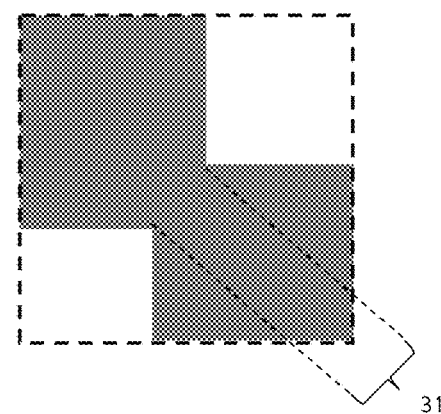
FIG. 7a shows a detailed view in which the region bounded by the dashed line from FIG. 7 is enlarged.
Figure 8:
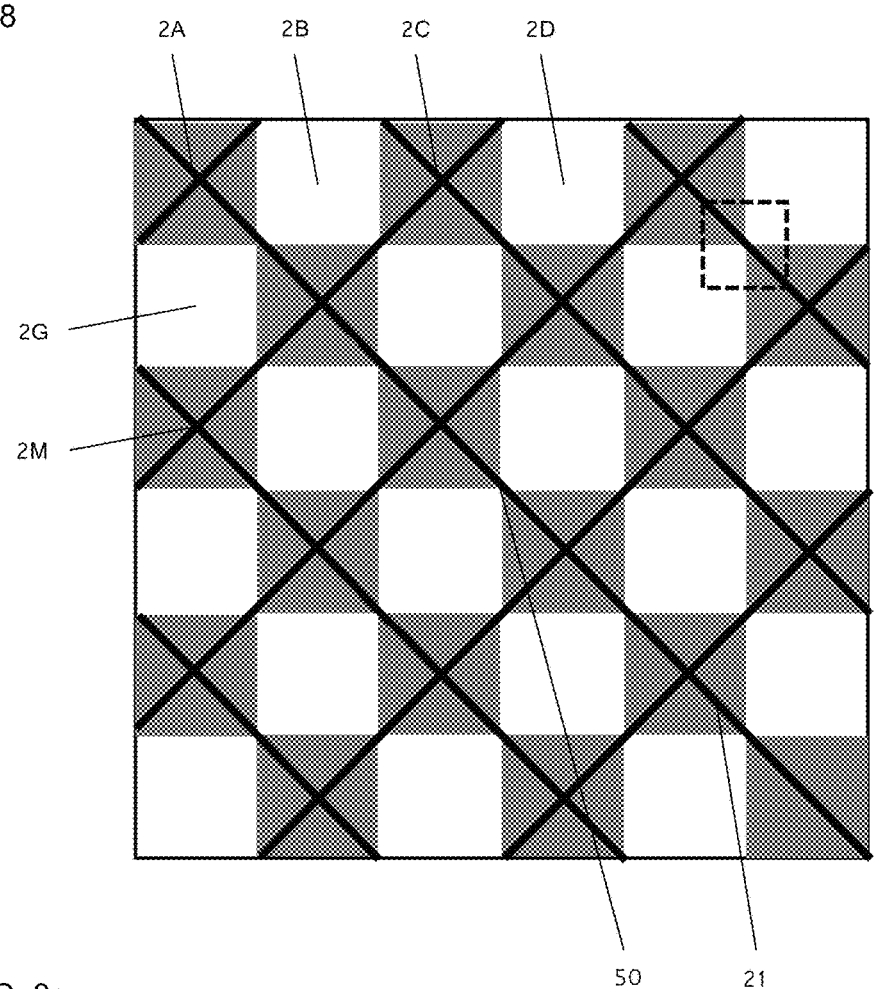
FIG. 8 corresponds to FIG. 7 and shows a structured front side metallization applied for supporting lateral current flow between the structured elements.
Figure 8A:
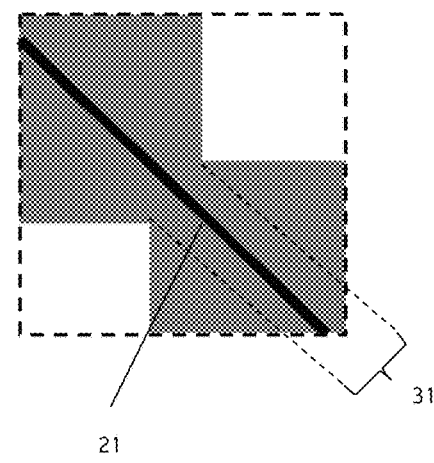
FIG. 8a corresponds to FIG. 7a and shows a structured front side metallization applied for supporting lateral current flow between the structured elements.

FIG. 8 and FIG. 8a correspond to FIG. 7 and FIG. 7a. It can be discerned in FIGS. 8 and 8a that a structured front side metallization 21 is applied for supporting the lateral current flow between the structured elements.

Figure 9:
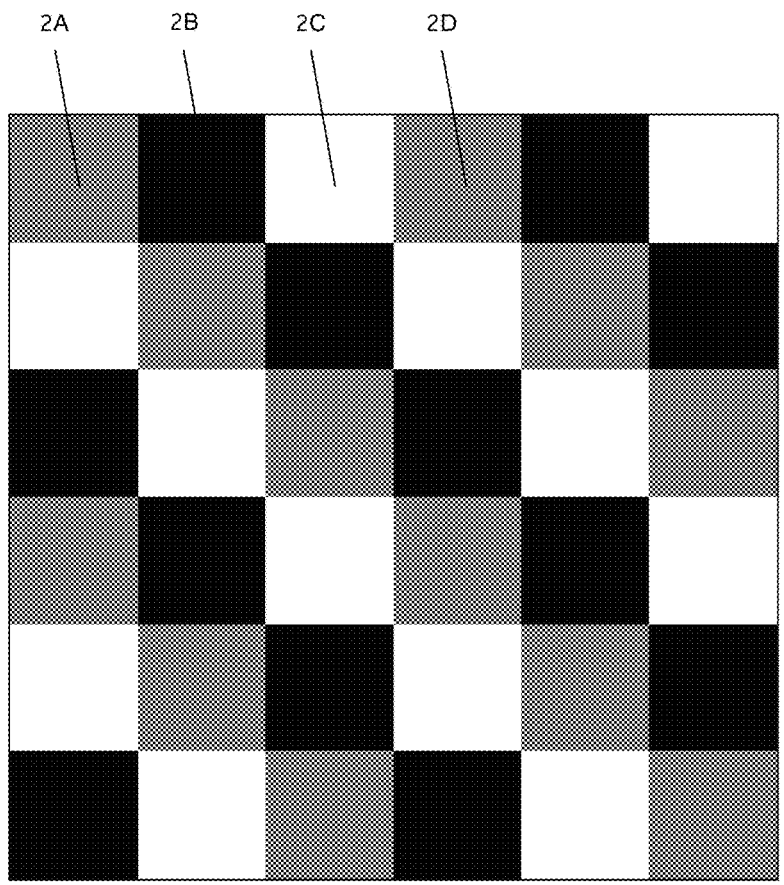
FIG. 9 illustrates a combination of an embodiment as shown if FIG. 7 with a multi-junction cell comprising three subcells.
Figure 9A:
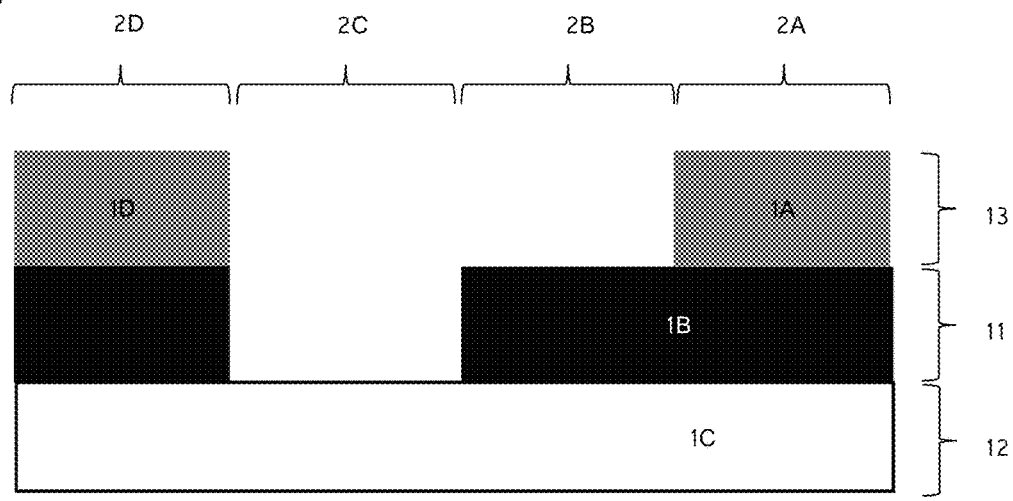
FIG. 9a shows a sectional view of segment regions and the associated subsegments of the embodiment shown in FIG. 9.

FIG. 9 and FIG. 9a illustrate the combination of the embodiment 7 with a multi-junction cell comprising three subcells 11, 12, 13 (as is also shown in the transition from FIG. 5 to FIG. 6). FIG. 9a in turn shows by way of example the sectional view for the segment regions 2A, 2B, 2C, 2D and the associated subsegments.

Figure 10:
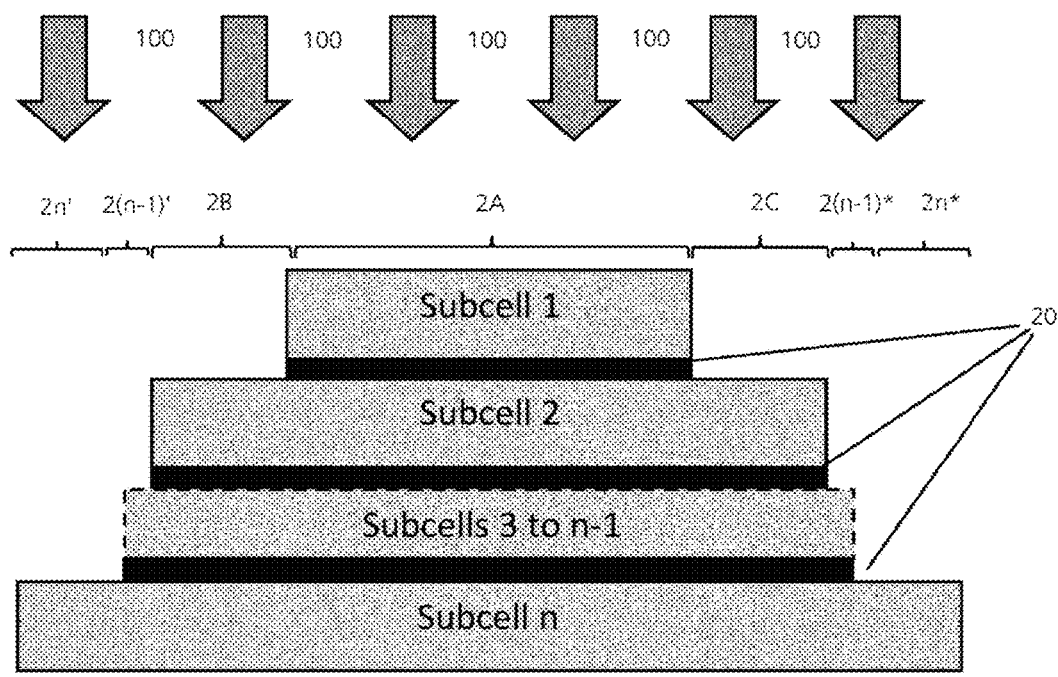
FIG. 10 shows an arrangement with a stepped multi-junction cell.
Figure 10A:
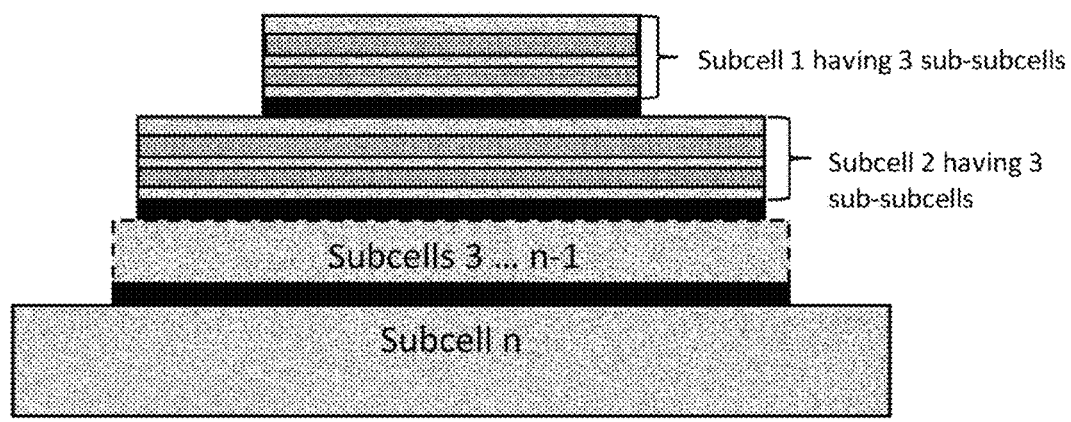
FIG. 10a shows the same arrangement with each subcell being formed again by three "sub subcells" having the same area, which are connected via tunnel diodes.

FIG. 10 once again shows the arrangement with the stepped multi-junction cell, in which—as explained above—the subcells 11, 12, 13, . . . are designated here by "subcell 1", "subcell 2", "subcells 3 to (n−1)", "subcell n", where n indicates the total number of subcells. They can be produced from identical or different materials. Tunnel diodes 20 are present therebetween. The area ratios, merely illustrated schematically here, are chosen so as to form segment regions 2A to which light can be applied directly, the pair 2B/2C, and the two pairs 2 (n−1)'/2(n−1)* and 2n'/2n*. FIG. 10a shows the same arrangement with each subcell being formed again by three "sub subcells" having the same area, which are connected via tunnel diodes, thus giving rise as it were to a stack having a number of subcells that is three times as high as the number of steps. In this case, the steps can each contain subcells which are formed from the same material and are accordingly suitable for monochromatic light.

Figure 10B:
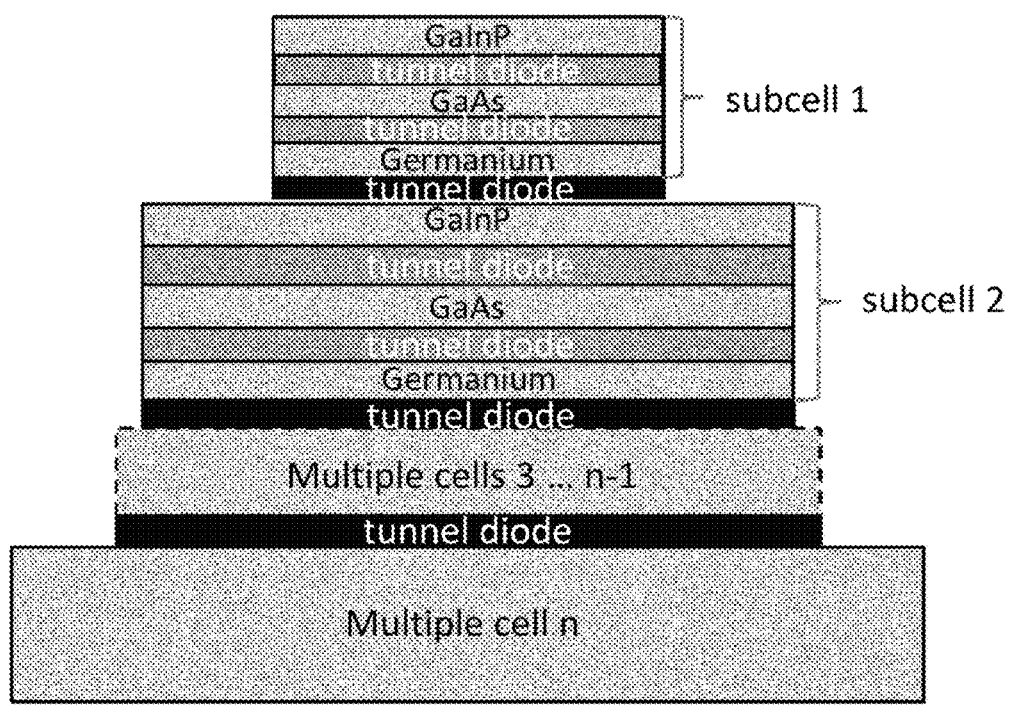
FIG. 10b shows the same arrangement as FIG. 10a but having examples of different materials of the subcells.
Figure 10C:
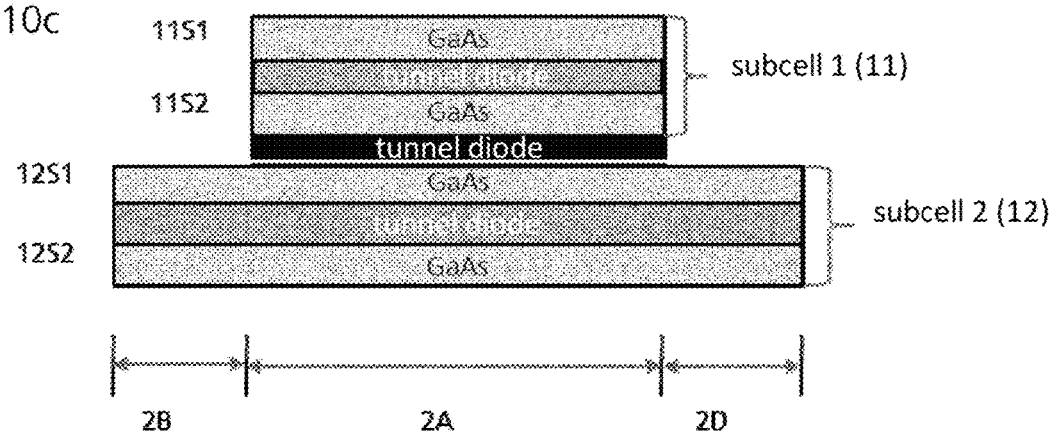
FIG. 10c shows a sectional view of a stepped arrangement of two double cells as subcells designed for monochromatic light.

FIG. 10b shows the same arrangement as FIG. 10a; however, examples of different materials of the subcells are explicitly presented here. FIG. 10c shows a special case with respect to FIG. 10a, once again in sectional illustration; in this case, the stepped arrangement of two double cells 11 and 12 as subcells designed for monochromatic light. The individual subcells and sub-subcells consist of identical materials. It goes without saying that the GaAs chosen in the illustration can likewise be GaInAs or some other suitable material, as described above. In the case of homogeneous illumination, the area ratios, in order to achieve current-matching, should be chosen such that the segment region 2A occupies the same area as the segment regions 2B and 2D together. With additional current-matching for the sub-subcells 11S1 to 11S2 and 12S1 to 12S2 by way of the thicknesses of said sub-subcells, a complete current-matching of all subcells and sub-subcells results. The arrangement in accordance with FIG. 10c can optimally also have a transparent transverse conduction layer 21 (not shown). High irradiances often occur in laser power applications. In order to carry away the high currents and to minimize the series resistance losses, such transparent transverse conduction layers can be integrated into the structure. For the transverse conduction layers 21, a material having a relatively large band gap can be chosen which is transparent to the incident, for example monochromatic, irradiation and which can be highly doped, for example, in order to achieve a high conductivity.

Figure 11:
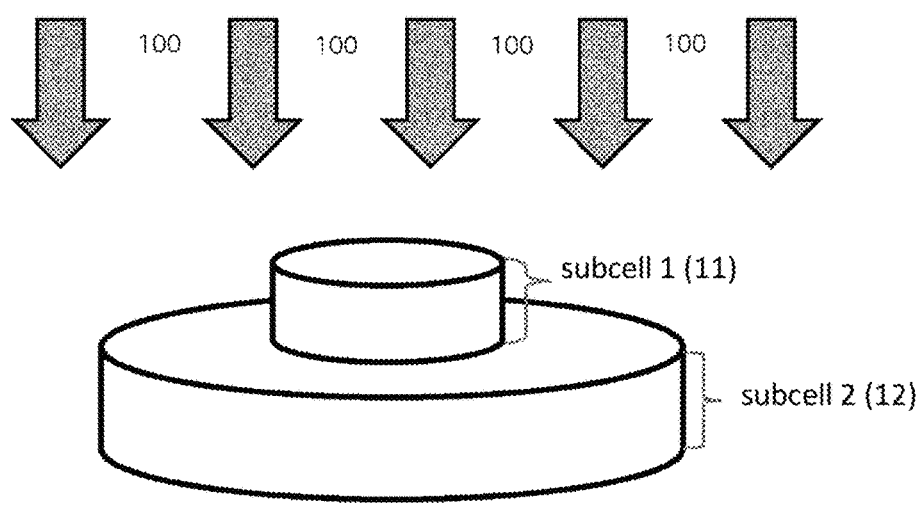
FIG. 11 shows an embodiment which shows how a stepped arrangement can be chosen if a non-homogeneous profile of the incident illumination is present.

FIG. 11 shows an embodiment which shows by way of example how a stepped arrangement can be chosen if a non-homogeneous profile of the incident illumination is present, for example a Gaussian profile. Here the areas formed by the segment regions are not of the same magnitude, but rather are matched to the intensity profile. The upper subcell 11, which—as explained above—can also be a multi-junction cell, is exposed to a higher intensity than the lower subcell 12 and therefore has a smaller surface area than that region of the surface of the subcell 12 which is directly exposable to electromagnetic radiation. It is thereby possible to realize current-matching for the subcell currents.

Figure 12A:
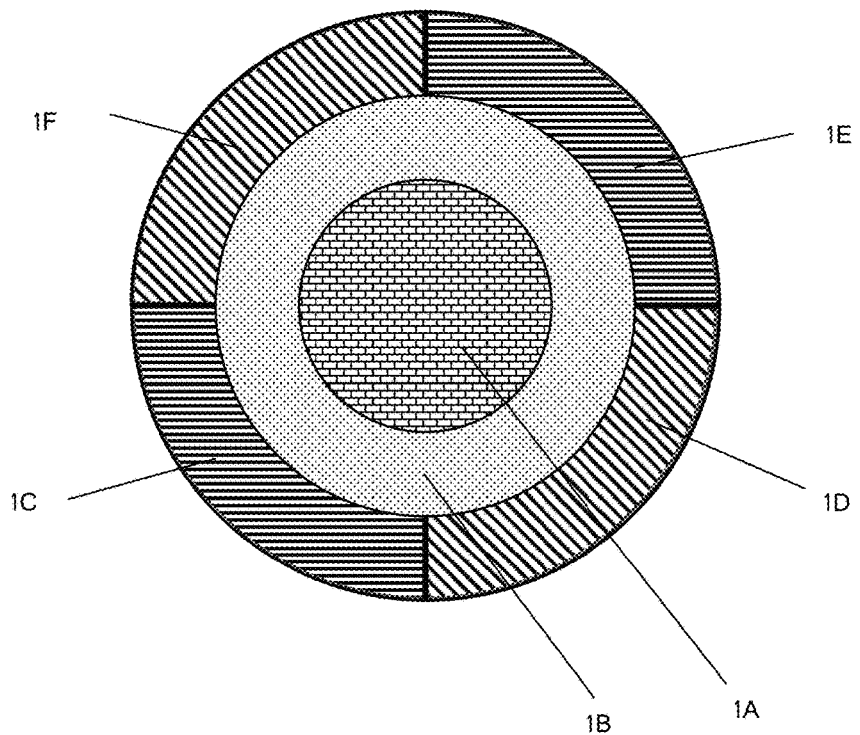
FIG. 12a shows a sectional view of an embodiment in which a stepped embodiment and simultaneously a lateral embodiment are present.
Figure 12B:
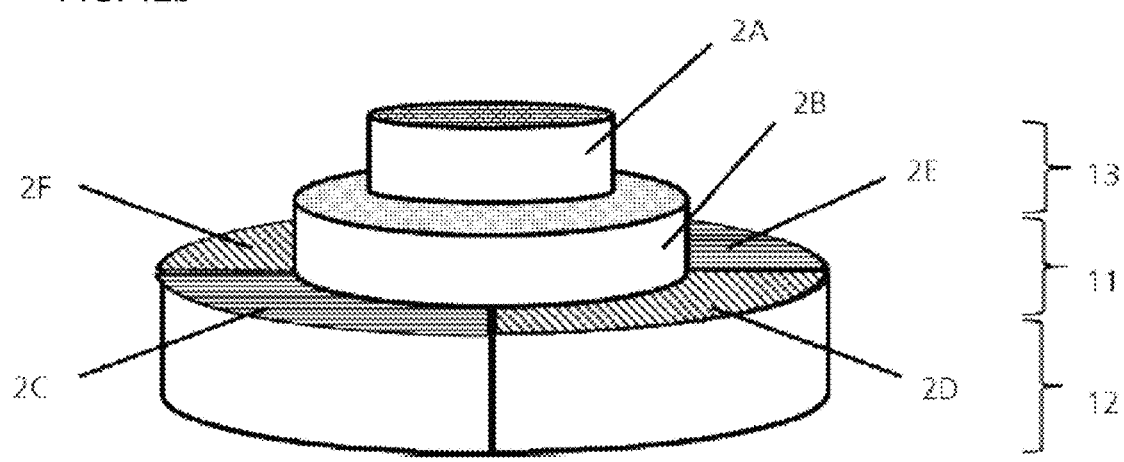
FIG. 12b shows a plan view of an embodiment in which a stepped embodiment and simultaneously a lateral embodiment are present.

FIGS. 12a and 12b show an embodiment in which a stepped embodiment and simultaneously the lateral embodiment are present. FIG. 12a shows the plan view, and FIG. 12b a lateral view. A triple cell comprising a non-segmented topmost subcell 13, a non-segmented middle subcell 11 and a segmented bottom subcell 12 is shown. Accordingly, the complete topmost subcell 13 is formed by the subsegment 1A, the middle subcell 11 is formed completely by the subsegment 1B and the bottommost subcell 12 is formed by the subsegments 1C, 1D, 1E and 1F, which in each case form a quarter circle. The topmost subcell 13 accordingly has a segment region 2A, the underlying subcell 11 has a ring shaped segment region 2B and the subcell 12 has in each case segment regions 2C, 2D, 2E and 2F, which in each case occupy the area of a ring divided into quarters. Such an embodiment is expedient particularly in the case of homogeneous irradiation since it is unimportant whether a segmentation is present in the region of the geometrical centroid. Rather what matters is that in the case of a slight pivoting or adjustment intolerance in the edge region the corresponding shadings can be compensated for there as well. It goes without saying that a layer that ensures the series/parallel interconnection of the subcells and subsegments according to the invention should be formed between the subcells 11 and 12 at least in subregions.

Figure 13:
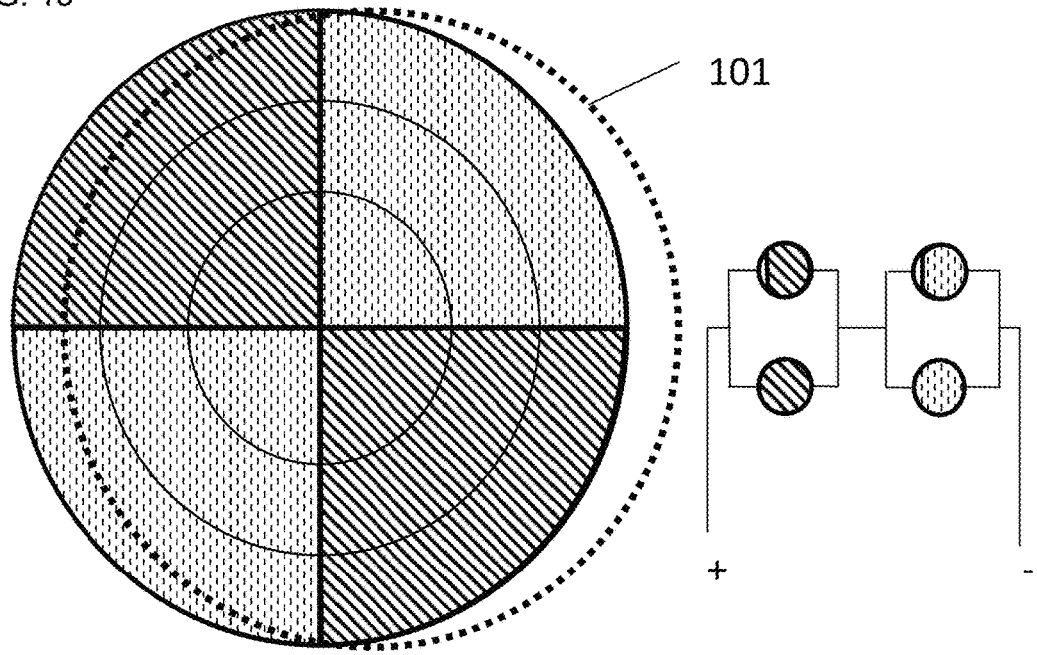
FIG. 13 shows a plain view of an arrangement corresponding to FIG. 12 but where all the subcells are each subdivided into 4 subsegments.

FIG. 13 shows an arrangement corresponding to FIG. 12 in plain view. However, here all the subcells are each subdivided into 4 subsegments. The three subcells are indicated by concentric circles. In contrast to FIG. 12, therefore, a stepped embodiment is present in which the segment regions of the upper semiconductor layers are not connected in parallel or do not form a single segment region, but rather are interconnected with the other segment regions only in the form of the complete triple cell present in the subsegment. On account of a Gaussian distribution of the incident light, for example, here the area of the innermost circle is chosen to be significantly smaller than that of the middle circle and thus the surface area of the annulus between the two middle circle lines is chosen to be greater than that of the innermost circle; the same correspondingly applies to the outermost annulus. FIG. 13 again shows the result upon the pivoting of the light spot 101, for example on account of incorrect adjustment. Segments illuminated to a lesser extent generate less current; as a result of the partial parallel connection, however, the current-matching of the series connection is maintained, as illustrated by the schematic depicted on the right. As already explained above, the tolerance can also be increased here by means of an increased number of segments.

Figure 14:
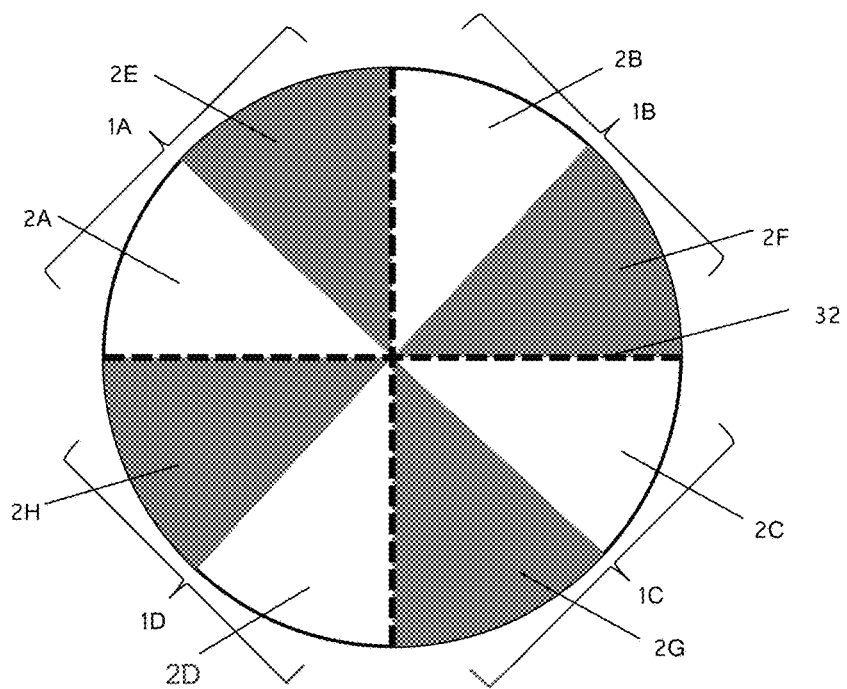
FIG. 14 shows an embodiment in which a stepped embodiment and a lateral embodiment are completely combined with one another.

FIG. 14 shows an embodiment in which the stepped embodiment and lateral embodiment are completely combined with one another. The dashed line here defines the isolation trench 32 between the subsegments. The subsegments are embodied in each case as a tandem cell, wherein in each case the upper and lower subcells of a subsegment are present in the stepped embodiment. In this case, the four segment regions of the upper subcells 2E, 2F, 2G, 2H are not directly interconnected with one another; rather, the subsegments 1A and 1C, and 1B and 1D are respectively interconnected in parallel with one another and the subsegment pairs 1A/1C and 1B/1D are interconnected in series with one another. A series interconnection is again present in each case within the subsegments on account of the stepped embodiment, wherein in each case the upper subcell is connected to the lower subcell via a tunnel diode. Therefore, in each case the segment regions 2A and 2E, 2B and 2F, 2C and 2G, and 2D and 2H are connected in series within a subsegment. Like FIG. 13, therefore, a stepped embodiment is present in which the segment regions of the topmost semiconductor layer are not connected in parallel or do not form a single segment region, but rather are interconnected with the other segment regions only in the form of the complete tandem cell present in the subsegment.

The invention claimed is:

1. A multi-junction photovoltaic cell comprising at least a first and a second subcell arranged one above another, said photovoltaic cell having a front side facing electromagnetic radiation and a back side facing away from said radiation,
wherein the front side is designed in a segmented manner and has at least three subsegments that each have at least a portion on which the electromagnetic radiation can impinge directly,
wherein said at least three subsegments are arranged one above another or laterally arranged, or both laterally arranged and one above another,
wherein the electromagnetic radiation can impinge directly on segment regions, at least one of said segment regions is formed on each subsegment,
wherein a first group of at least two of the subsegments of the front side are electrically connected in parallel with one another, wherein said at least two of the subsegments are directly interconnected by at least one of a metallic connector, a conductor track, a bar made of semiconductor material, or any combination thereof, wherein said first group of subsegments forms a first segment type, wherein two subsegments of the first group are opposite of each other with respect to a point in a region of a geometrical centroid of the front side, wherein the region of the geometrical centroid of the front side is a region of a circle around the geometrical centroid whose surface area is fifty percent of the front side on which the electromagnetic radiation can impinge directly, and a second group of at least one of the subsegments forms a second segment type, wherein the subsegments of the first group are interconnected in series with the subsegments of the second group, wherein said at least three subsegments are arranged such that, at least in the region of the geometrical centroid of the front side, at least two separate segment regions, on which the electromagnetic radiation can impinge directly, are formed on the first and second segment types in each case, and wherein the first subcell having a first front side area is arranged above the second subcell having a second front side area, said second front side area is smaller than the first front side area of the second subcell such that a stepped arrangement is present, wherein said first subcell comprises at least the first segment type and said second subcell comprises at least the second segment type.

2. The photovoltaic cell according to claim 1, wherein the front side of the photovoltaic cell has at least four laterally arranged subsegments at least in the first subcell, the second segment type is present in said at least four subsegments, and wherein at least two subsegments of said at least four subsegments are at least one of: interconnected in parallel with one another or connected to one another via a transition region that ensures a lateral current flow.

3. The photovoltaic cell according to claim 1, wherein the photovoltaic cell comprises at least a third subcell arranged above the first subcell and having a third front side area,
wherein a third segment type is present at least in the third subcell, said third subcell comprising at least one subsegment,
wherein said at least one subsegment of the third subcell is interconnected in series at least with the subsegments of the first or the second segment type, and wherein the third front side area is smaller than the first front side area.

4. The photovoltaic cell according to claim 3, wherein at least two of the subcells arranged one above another are formed from materials having a substantially equal band gap.

5. The photovoltaic cell according to claim 1, wherein the photovoltaic cell is monolithically stacked.

6. The photovoltaic cell according to claim 1, wherein at least two of the subcells are connected by means of tunnel diodes.

7. The photovoltaic cell according to claim 1, wherein at least in the region of the geometrical centroid of the front side, the area occupied by the segment regions of the first segment type and the area occupied by segment regions of each further segment type are of substantially the same magnitude.

8. The photovoltaic cell according to claim 1, wherein at least in the region of the geometrical centroid of the front side, the segment regions of the first segment type and the segment regions of the second segment type are alternating.

9. The photovoltaic cell according to claim 1, wherein the geometrical arrangement of the segment regions of the first segment type and the geometrical arrangement of the segment regions of each further segment type is chosen such that
upon incidence of a light cone which forms within the area of the front side a circle having a circle area that is exactly 80% of the area of the front side, for any arbitrary arrangement of the circle within the area of the front side, an area ratio between the segment regions of the first segment type present within the circle formed by the light cone and the segment regions of each further segment type present within the circle formed by the light cone, is between 0.95 and 1.05.

10. The photovoltaic cell according to claim 1, wherein at least in the region of the geometrical centroid of the front side, the segment regions which become located on mutually mirror symmetrical regions of a straight line running through the geometrical centroid of the front side belong to identical segment types in the case of a number of segment regions that is divisible by a number of segment types and additionally divisible by 2, and belong to different segment types in the case of a number of segment regions that is divisible by the number of segment types but not additionally divisible by 2.

11. The photovoltaic cell according to claim 1, wherein at least in the region of the geometrical centroid of the front side, the segment regions substantially have the shape of a circle sector, of a trapezoid, of a triangle, of a rectangle or of a square.

12. The photovoltaic cell according to claim 1, wherein at least six separate segment regions are present.

13. The photovoltaic cell according to claim 1, wherein the photovoltaic cell is a multi-junction cell having three to six stacked subcells.

14. The photovoltaic cell according to claim 1, wherein the photovoltaic cell is a solar cell.

15. A multi-junction photovoltaic cell comprising at least a first and a second subcell arranged one above another, the photovoltaic cell having a front side facing electromagnetic radiation and a back side facing away from the electromagnetic radiation,
wherein the front side includes at least three subsegments that each have at least a portion on which the electromagnetic radiation can impinge directly,
wherein the at least three subsegments are arranged one above another or laterally arranged or both laterally arranged and one above another,
wherein a plurality of segment regions are regions of the subsegments on which the electromagnetic radiation can impinge directly, at least one of the segment regions is on each subsegment,
wherein a first group of at least two of the subsegments of the front side are electrically connected in parallel with one another, wherein said at least two of the subsegments are directly interconnected by at least one of a metallic connector, a conductor track, a bar made of semiconductor material, or any combination thereof,
wherein the first group of subsegments forms a first segment type, wherein two subsegments of the first group are opposite of each other with respect to a point in a region of a geometrical centroid of the front side, wherein the region of the geometrical centroid of the front side is a region of a circle around the geometrical centroid whose surface area is fifty percent of the front side on which the electromagnetic radiation can impinge directly, and a second group of at least one of the subsegments forms a second segment type, wherein the subsegments of the first group are connected in series with the subsegments of the second group, wherein the at least three subsegments are in an arrangement in which, at least in the region of the geometrical centroid of the front side, at least two separate segment regions, on which the electromagnetic radiation can impinge directly, are on each of the first and second segment types, wherein the first subcell and the second subcell are in a stepped arrangement in which the first subcell having a first front side area is arranged above the second subcell having a second front side area, the second front side area is smaller than the first front side area of the second subcell, wherein the first subcell comprises at least the first segment type and the second subcell comprises at least the second segment type, and wherein the first subcell and the second subcell arranged one above another are formed from materials having a substantially equal band gap.

16. A multi-junction photovoltaic cell comprising at least a first and a second subcell arranged one above another, the photovoltaic cell having a front side facing electromagnetic radiation and a back side facing away from the radiation, wherein the front side includes at least three subsegments that each have at least a portion on which the electromagnetic radiation can impinge directly, wherein the at least three subsegments are arranged one above another or laterally arranged or both laterally arranged and one above another, wherein a plurality of segment regions are regions of the subsegments on which the electromagnetic radiation can impinge directly, at least one of the segment regions is on each subsegment, wherein a first group of at least two of the subsegments of the front side are electrically connected in parallel with one another, wherein said at least two of the subsegments are directly interconnected by at least one of a metallic connector, a conductor track, a bar made of semiconductor material, or any combination thereof, wherein the first group of subsegments forms a first segment type, wherein two subsegments of the first group are opposite of each other with respect to a point in a region of a geometrical centroid of the front side, wherein the region of the geometrical centroid of the front side is a region of a circle around the geometrical centroid whose surface area is fifty percent of the front side on which the electromagnetic radiation can impinge directly, and a second group of at least one of the subsegments forms a second segment type, wherein the subsegments of the first group are connected in series with the subsegments of the second group, wherein the at least three subsegments are arranged such that, at least in the region of the geometrical centroid of the front side, at least two separate segment regions, on which the electromagnetic radiation can impinge directly, are on each of the first and second segment types, wherein the first subcell and the second subcell are in a stepped arrangement in which the first subcell having a first front side area is arranged above the second subcell having a second front side area, the second front side area is smaller than the first front side area of the second subcell, wherein the first subcell comprises at least the first segment type and the second subcell comprises at least the second segment type, and wherein the segment regions are arranged such that a pivoting of a light cone that forms a circular light spot on the front side of the photovoltaic cell causes a reduction in an amount of the electromagnetic radiation that impinges both the segment regions of the first segment type and the segment regions of the second segment type.

17. The photovoltaic cell according to claim 1, wherein at least one of the subsegments of the second group is disposed between the two subsegment of the first group.

* * * * *